United States Patent
Jung et al.

(10) Patent No.: US 11,226,361 B2
(45) Date of Patent: Jan. 18, 2022

(54) DEVICE AND METHOD FOR DETECTING FAILURE LOCATION OF UNDERGROUND CABLE

(71) Applicant: KOREA ELECTRIC POWER CORPORATION, Naju-si (KR)

(72) Inventors: Chae-Kyun Jung, Daejeon (KR); Yong-June Shin, Seoul (KR); Gu-Young Kwon, Seoul (KR); Tae-Kyun Kim, Daejeon (KR); Jae-Sang Hwang, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 0 days.

(21) Appl. No.: 16/652,135

(22) PCT Filed: Aug. 24, 2018

(86) PCT No.: PCT/KR2018/009811
§ 371 (c)(1),
(2) Date: Mar. 30, 2020

(87) PCT Pub. No.: WO2019/083144
PCT Pub. Date: May 2, 2019

(65) Prior Publication Data
US 2020/0249266 A1    Aug. 6, 2020

(30) Foreign Application Priority Data

Oct. 24, 2017 (KR) ........................ 10-2017-0138072

(51) Int. Cl.
*G01R 31/11* (2006.01)
*G01R 31/08* (2020.01)

(52) U.S. Cl.
CPC ............ *G01R 31/11* (2013.01); *G01R 31/083* (2013.01); *G01R 31/088* (2013.01)

(58) Field of Classification Search
CPC ..... G01R 31/11; G01R 31/083; G01R 31/088
(Continued)

(56) References Cited

U.S. PATENT DOCUMENTS

| 2016/0139195 A1* | 5/2016 | Chen ...................... G01R 31/11 |
| | | 307/131 |
| 2016/0266192 A1* | 9/2016 | Burek .................. G01R 31/088 |

(Continued)

FOREIGN PATENT DOCUMENTS

| JP | 2005-532549 A | 10/2005 |
| KR | 10-0486972 B1 | 5/2005 |

(Continued)

OTHER PUBLICATIONS

Wei, Chen, and Wang Li. "The study of spread spectrum time domain reflectometry for cable fault detection and location on-line." 2011 International Conference on Electric Information and Control Engineering. IEEE, 2011. (Year: 2011).*

(Continued)

*Primary Examiner* — Christopher P McAndrew
(74) *Attorney, Agent, or Firm* — Foundation Law Group, LLP

(57) ABSTRACT

An apparatus and a method for detecting a fault location of an underground cable are proposed. The apparatus includes: an optimal reference signal design unit configured to design a reference signal for detecting the fault location of the underground cable considering propagation characteristics of the underground cable according to a time-frequency domain reflectometry method; a signal application and acquisition unit configured, as the designed reference signal is generated and applied to the underground cable, to acquire the reference signal applied to the underground cable and a reflected signal of the applied reference signal; and a data analysis unit configured to analyze whether a fault location (Continued)

of the underground cable exists according to a decision on similarity between the reference signal and the reflected signal after obtaining a time-frequency domain energy distribution for the acquired reference signal and reflected signal.

12 Claims, 17 Drawing Sheets

(58) Field of Classification Search
USPC .......................................................... 324/533
See application file for complete search history.

(56) References Cited

U.S. PATENT DOCUMENTS

2016/0266193 A1* 9/2016 Ennis ........................ H02H 7/22
2016/0266194 A1* 9/2016 Ben Hassen ............ G01R 31/11

FOREIGN PATENT DOCUMENTS

| KR | 10-2012-0113076 A | 10/2012 |
|---|---|---|
| KR | 10-1525475 B1 | 6/2015 |
| KR | 10-1570506 B1 | 11/2015 |
| KR | 10-1570508 B1 | 11/2015 |
| KR | 10-1645602 B1 | 8/2016 |

OTHER PUBLICATIONS

Naik, Suketu, Cynthia M. Furse, and Behrouz Farhang-Boroujeny. "Multicarrier reflectometry." IEEE Sensors Journal 6.3 (2006): 812-818. (Year: 2006).*

Xu, Hang, et al. "Chaos time domain reflectometry for fault location on live wires." J. Appl. Anal. Comput 5.2 (2015): 243-250. (Year: 2015).*

Choe, TokSon, et al. "Implementation of a time-frequency domain reflectometry system with PXI platform for a coaxial cable [fault location]." Proceedings of the 21st IEEE Instrumentation and Measurement Technology Conference (IEEE Cat. No. 04CH37510). vol. 2. IEEE, 2004. (Year: 2004).*

* cited by examiner

DEVICE AND METHOD FOR DETECTING FAILURE LOCATION OF UNDERGROUND CABLE

CROSS-REFERENCE TO RELATED APPLICATIONS

This application claims the benefit under 35 U.S.C. Section 371, of PCT International Application No. PCT/KR2018/009811, filed on Aug. 24, 2018, which claimed priority to Korean Patent Application No. KR 10-2017-0138072, filed on Oct. 24, 2017, the disclosures of which are hereby incorporated by the references.

TECHNICAL FIELD

The present invention relates to an apparatus and a method for detecting a fault location of an underground cable. More particularly, the present invention relates to an apparatus and a method for detecting a fault location of an underground cable, the apparatus and method being configured to design an optimal reference signal in consideration of propagation characteristics of the underground cable using a time-frequency domain reflectometry method and to analyze a reflected signal obtained by applying the reference signal to the underground cable that is an object to be diagnosed, and the reference signal, thereby accurately detecting and predicting a fault location of the underground cable.

BACKGROUND ART

Conventionally, a fault location of an underground cable was detected by using methods such as a Murray loop method using a principle of Wheatstone bridge, a TDR method using a principle of traveling wave or a FDR method, an ARM, a pinpointing method, and the like.

First, in the Murray loop method, it is necessary at least one sound phase exists for accurate measurement, and in the case of a single line-to-ground fault, the ground resistance at a point of a fault should be close to zero to make the measurement accurate. Meanwhile, the Murray loop method is advantageous in increasing DC voltage as much as possible for accurate measurement and has a drawback that, when a ground resistance value at the point of the fault is high, the current flowing to the ground is small so that the galvanometer may not accurately measure the current or the measurement error may increase.

The TDR method and ARM use a principle of impedance variation in the event of a fault occurrence but have a disadvantage of being very expensive and are difficult for detecting the fault location in the case of a high resistance fault. Accordingly, experiences as well as a high degree of expertise and proficiency are required to accurately detect the fault location.

Here, the reflectometry method may be largely classified into the TDR method and the FDR method, depending on a type of a signal.

The TDR method analyzes the reflected wave in the time domain by applying a step signal having a resolution in the time domain. On the other hand, the FDR method analyzes the reflected wave in the frequency domain by applying a sine wave signal having resolution in the frequency domain to the cable.

Meanwhile, the TDR method and the FDR method may observe the reflected wave at the impedance mismatch point according to a principle of the reflected wave processing method, but have a drawback of difficulty of detecting small defects due to limitation of the resolution.

In addition, the TDR method and the FDR method have a limitation for the use for local insulation breakdown inspection and defect detection on an actual cable, due to distortion of the reflected waveform.

In addition, according to an uncertainty principle of signal and information theory, the TDR method and the FDR method are not allowed to arbitrarily have very small resolution of the time domain and frequency domain at the same time.

Accordingly, the TDR method becomes to lose the resolution of the frequency domain because the resolution of the time domain has been increased, and the FDR method becomes to lose the resolution of the time domain because the resolution of the frequency domain has been increased.

However, the time-frequency domain reflectometry method has introduced flexibility to the reference signal design area where the conventional reflectometry method used to have limitations. That is, the time-frequency domain reflectometry method uses a Gaussian enveloped linear chirp signal, as a reference signal, in which frequency linearly increases along time. Thus, a design using an optimal signal suitable for the propagation characteristics of the cable may be made in the time-frequency domain. Accordingly, the Gaussian envelope in the time-frequency domain may have the highest resolution in both the time and frequency domains according to the uncertainty principle.

Therefore, in the related art, a method capable of improving the accuracy of detecting the fault location of the underground cable by utilizing the advantages of the reflectometry processing method in the time-frequency domain is needed.

DISCLOSURE

Technical Problem

Accordingly, the present invention has been made keeping in mind the above problems occurring in the related art, and the present invention is intended to propose an apparatus and a method for detecting a fault location of an underground cable, the apparatus and method being configured to design an optimal reference signal in consideration of propagation characteristics of the underground cable using a time-frequency domain reflectometry method and to analyze a reflected signal obtained by applying the reference signal to the underground cable that is an object to be diagnosed, and the reference signal, thereby accurately detecting and predicting a fault location of the underground cable.

Technical Solution

In order to achieve the above objective, there may be provided an apparatus for detecting a fault location of an underground cable according to an embodiment of the present invention, the apparatus including: an optimal reference signal design unit configured to design a reference signal for detecting the fault location of the underground cable considering propagation characteristics of the underground cable according to a time-frequency domain reflectometry method; a signal application and acquisition unit configured, as the designed reference signal is generated and applied to the underground cable, to acquire the reference signal applied to the underground cable and a reflected signal of the applied reference signal; and a data analysis unit configured to analyze whether a fault location of the underground cable exists according to a decision on similarity between the reference signal and the reflected signal after obtaining a time-frequency domain energy distribution for the acquired reference signal and reflected signal.

The propagation characteristics of the underground cable may be a cable structure, cable insulation layer material, and a type of cable installation.

The optimal reference signal design unit may select center frequency, frequency bandwidth, and time width of the reference signal in values optimized for the underground cable in order for detecting a fault location of the underground cable.

The selected frequency bandwidth and time width of the reference signal may be set so as to have a value of a product thereof to be at least 0.5.

The optimal reference signal design unit may include: a signal and algorithm setting unit configured to set signal information and algorithm information for designing the reference signal for detecting a fault location of the underground cable; a center frequency determination unit configured to determine optimal center frequency candidate group by checking a change in magnitude of a cross-correlation function according to a change in the center frequency after identifying maximum center frequency through an endpoint check; a frequency bandwidth determination unit configured to determine optimal frequency bandwidth by checking a change in the magnitude of the cross-correlation function according to a change in the frequency bandwidth after fixing the center frequency candidate group and the appropriate time width; and a time width determination unit configured to determine optimal time width by checking a change in magnitude of the cross-correlation function according to a change in the time width after fixing the center frequency candidate group and the optimal frequency bandwidth.

The signal application and acquisition unit may include: a reference signal generation unit configured to generate the designed reference signal; a waveform measurement unit configured to measure the reference signal applied to the underground cable and the reflected signal for the applied reference signal; and an underground cable connection unit configured to apply the reference signal generated by the reference signal generation unit to the underground cable and transfer the reflected signal transferred from the underground cable to the waveform measurement unit.

According to an embodiment, the apparatus may further include: an amplification unit connected to the reference signal generation unit and configured to apply the amplified reference signal to the underground cable through the underground cable connection unit by amplifying the reference signal generated by the reference signal generation unit.

The underground cable connection unit may be configured by connecting a T connector and a BNC connector in series, and the BNC connector may be configured to have a (+) terminal connected to a conductor layer of the underground cable and a (−) terminal connected to a sheath layer of the underground cable.

The data analysis unit may be configured to obtain the time-frequency domain energy distribution for the acquired reference signal and reflected signal, through a localized Wigner-Ville distribution for as much as a specific section.

The data analysis unit may be configured to decide similarity between the reference signal and reflected signal using a normalized value between zero and one through a cross-correlation function of the time-frequency domain for the reference signal and reflected signal.

According to an embodiment, the apparatus may further includes a user interface unit configured to provide a graphic user interface (GUI) for a processing process of each of the optimal reference signal design unit, the signal application and acquisition unit, and the data analysis unit.

In addition, there may be provided a method for detecting a fault location of an underground cable according to an embodiment of the present invention, the method including: designing a reference signal for detecting a fault location of the underground cable considering propagation characteristics of the underground cable according to a time-frequency domain reflectometry method; acquiring the reference signal applied to the underground cable and the reflected signal of the applied reference signal, as the designed reference signal is generated and applied to the underground cable; and analyzing whether a fault location of the underground cable exists according to a decision on similarity between the reference signal and the reflected signal after obtaining a time-frequency domain energy distribution for the acquired reference signal and reflected signal.

The designing may include: setting signal information and algorithm information for designing a reference signal for detecting a fault location of the underground cable; determining optimal center frequency candidate group by checking a change in magnitude of a cross-correlation function according to a change in the center frequency after identifying maximum center frequency through an endpoint check; determining optimal frequency bandwidth by checking a change in magnitude of the cross-correlation function according to a change in the frequency bandwidth after fixing the center frequency candidate group and the appropriate time width; and determining optimal time width by checking a change in magnitude of the cross-correlation function according to a change in the time width after fixing the center frequency candidate group and the appropriate time width.

The analyzing may obtain the time-frequency domain energy distribution for the acquired reference signal and reflected signal, through a localized Wigner-Ville distribution for as much as a specific section.

The analyzing may decide similarity between the reference signal and reflected signal using a normalized value between zero and one through a cross-correlation function of the time-frequency domain for the reference signal and reflected signal.

Advantageous Effects

The present invention designs an optimal reference signal in consideration of the propagation characteristics of the underground cable using a time-frequency domain reflectometry method and analyzes the reflected signal obtained by applying the reference signal to the underground cable that is an object to be diagnosed, and the reference signal, whereby a fault location of the underground cable can be accurately detected and predicted.

In addition, the present invention can diagnose the fault location of the underground cable by designing the most optimal signal according to a cable structure, cable insulation layer material, and a type of cable installation, of the underground cable, which is an object.

In addition, the present invention prevents the distortion of the signal analysis, due to a cross-term through the existing Winner-Ville distribution, by utilizing the concept of the localized Wigner-Ville distribution, whereby the possibility of misrecognition of a fault location due to the cross-term can be eliminated.

In addition, in designing a reference signal having an optimal parameter for each frequency characteristic, the present invention can select the center frequency in consideration of the attenuation characteristics and resolution for each frequency of the cable, minimize signal distortion due to the attenuation characteristics of the cable, and set the time width on the basis of the uncertainty principle.

MODE FOR INVENTION

Figure 1:
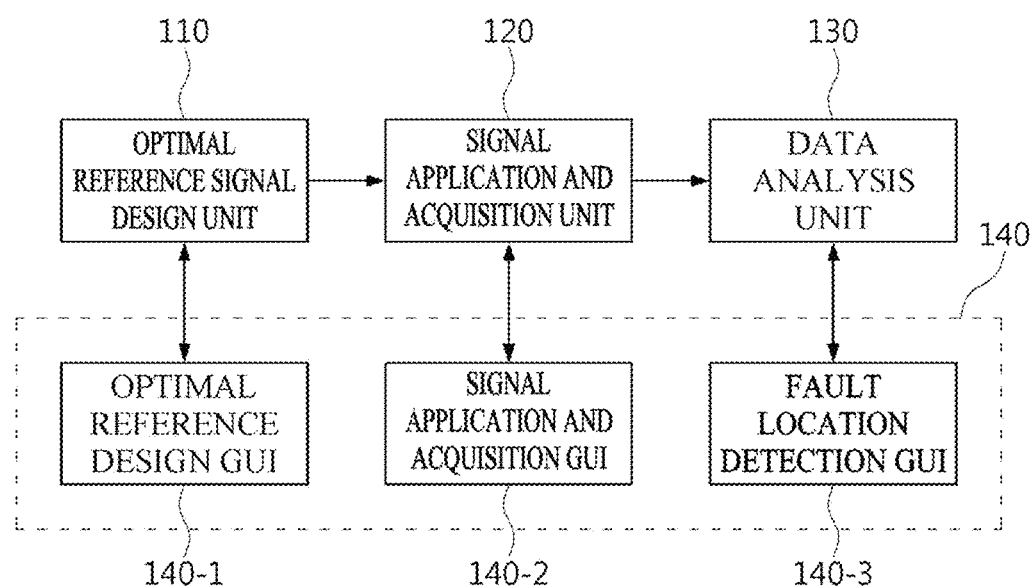
FIG. 1 is a view illustrating an apparatus for detecting a fault location of an underground cable according to an embodiment of the present invention.

Hereinafter, exemplary embodiments of the present invention will be described in detail with reference to the accompanying drawings. However, in the following description and accompanying drawings, detailed descriptions of well-known functions or configurations that may obfuscate the subject matter of the present invention are omitted. In addition, it should be noted that the same components throughout the drawings are denoted by the same reference numerals as much as possible.

The terms or words used in the present specification and claims described below should not be interpreted as being limited to ordinary or dictionary meanings and, on the basis of the principle that the inventor may properly define his or her invention in terms that best describe the invention, should be interpreted as meaning and concept consistent with the technical idea of the present invention.

Therefore, the embodiments described in this specification and configurations shown in the drawings are only the most exemplary embodiments of the present invention, and do not represent all of the technical spirits of the present invention. Accordingly, it should be understood that at the time of the present application, there may be various equivalents and modifications that may replace them.

In the accompanying drawings, some components are exaggerated, omitted, or schematically illustrated, and the size of each component does not entirely reflect the actual size. The present invention is not limited by the relative size or spacing drawn in the accompanying drawings.

When a part of the specification "includes" a certain component, this means that other components may be further included instead of excluding other components unless specifically stated otherwise. In addition, when a part is said to be "connected" to another part, this includes not only a case of "directly connected" but also even a case of "electrically connected" while having other elements interposed in between.

Singular expressions include plural expressions unless the context clearly indicates otherwise. The terms "include" or "have" are intended to indicate the presence of features, numbers, steps, actions, components, parts or combinations thereof described in the specification and should be understood that the possibility of the presence or addition of one or more other features, numbers, steps, actions, components, parts or combinations thereof is not excluded in advance.

Also, the term "unit" used in the specification means software, and hardware component such as FPGA or ASIC, and the "unit" performs certain roles. However, the "unit" is not meant to be limited to software or hardware. The "unit" may be configured to be in an addressable storage medium or may be configured to reproduce one or more processors. Thus, as an example, the "unit" includes components such as software components, object-oriented software components, class components, and task components, and processes, functions, attributes, procedures, subroutines, segments of program code, drivers, firmware, microcode, circuits, data, database, data structures, tables, arrays, and variables. The functionality provided in components and "units" may be combined with a smaller number of components and "units" or further separated with additional components and "units".

Hereinafter, exemplary embodiments of the present invention will be described in detail with reference to the accompanying drawings so that those skilled in the art to which the present invention pertains may easily implement. However, the present invention may be implemented in many different forms and is not limited to the embodiments described herein. In addition, in order to clearly describe the present invention in the drawings, parts irrelevant to the description are omitted, and like reference numerals are assigned to similar parts throughout the specification.

Hereinafter, exemplary embodiments of the present invention will be described with reference to the accompanying drawings.

FIG. 1 is a view illustrating an apparatus for detecting a fault location of an underground cable according to an embodiment of the present invention.

As shown in FIG. 1, the apparatus for detecting a fault location of an underground cable according to an embodiment of the present invention (hereinafter referred to as 'a fault location detection apparatus 100) detects a fault location of an underground cable using a time-frequency domain reflectometry method.

That is, when a fault occurs in an underground cable, the fault location detection apparatus 100 detects whether the cable is faulty and a fault location by analyzing reflected wave generated due to the impedance change at the fault location of the cable.

Specifically, propagation of an electrical signal in an underground cable is determined according to cable line constants such as resistance, inductance, and capacitance.

However, when the underground cable has a local fault, a local impedance change occurs at the fault location of the cable. In this case, a reflected wave is generated at the impedance mismatch point of the cable when an electrical signal is applied to the cable.

Accordingly, the fault location detection apparatus 100 may detect whether the cable is faulty or not by analyzing the waveform of the reflected wave generated at the impedance mismatch point using the time-frequency domain reflectometry method.

As described above, unlike a time domain reflectometry (TDR) method or a frequency domain reflectometry (FDR) method, the time-frequency domain reflectometry method has an advantage of being able to design an optimal reference signal (input signal) according to the propagation characteristics of the underground cable, which is an object of fault location detection.

The fault location detection apparatus 100 above is configured to include an optimal reference signal design unit 110, a signal application and acquisition unit 120, a data analysis unit 130, and a user interface unit 140.

The optimal reference signal design unit 110 designs the optimal reference signal by analyzing the propagation characteristics of the underground cable, the signal application and acquisition unit 120 acquires the reference signal and the reflected signal by generating and applying the optimal reference signal for detecting the fault location of the underground cable, and the data analysis unit 130 analyzes the measurement data for detecting the fault location of the underground cable.

Hereinafter, the components of the fault location detection apparatus 100 will be described in detail.

The optimal reference signal design unit 110 designs an optimal reference signal for diagnosing the underground cable by applying the time-frequency domain reflectometry method. In addition, the optimal reference signal design unit 110 considers the propagation characteristics of the underground cable when designing the optimal reference signal.

The propagation characteristics of the underground cable correspond to the most important information when designing an optimal reference signal and may vary depending on a cable structure (e.g. conductor layer-insulation layer-metal sheath layer-anticorrosive layer, and the like), cable insulation layer material (e.g. XLPE, OF, MI, MI-PPLP, and the like), and a type of cable installation (e.g. seabed, electric power tunnel, cable duct, direct buried cable, and the like). Therefore, it is important to properly design the reference signal in consideration of the propagation characteristics of the underground cable in order for detecting the fault location of the underground cable.

For the reason as above, the optimal reference signal design unit 110 designs an optimal reference signal by selecting a section, in which the propagation characteristics of the underground cable are linear and the amount of attenuation is constant, in the frequency domain.

That is, the optimal reference signal design unit 110 selects three elements (i.e. center frequency, frequency bandwidth, and time width) of the reference signal as values optimized for the underground cable, which is the object of fault location detection, thereby designing the optimal reference signal.

Fundamentally, the optimal reference signal design unit 110 uses a Gaussian enveloped linear chirp signal as in equation 1 as a reference signal.

$$s(t) = \left(\frac{\alpha}{\pi}\right)^{\frac{1}{4}} e^{-\frac{\alpha(t-t_0)^2}{2} + \frac{j\beta t^2}{2} + j\omega_0(t-t_0)} \qquad \text{[Equation 1]}$$

Here, $t$ and $t_0$ represent time and initial time, respectively. $\alpha$ is a Gaussian constant, and $\beta$ represents a frequency increase rate. $\omega_0$ is initial angular velocity and represents a center frequency. Time width is determined by $\alpha$, and a frequency bandwidth is determined by $\alpha$ and $\beta$.

In addition, $(\pi/\pi)^{1/4}$ is used for signal energy normalization.

Figure 2:
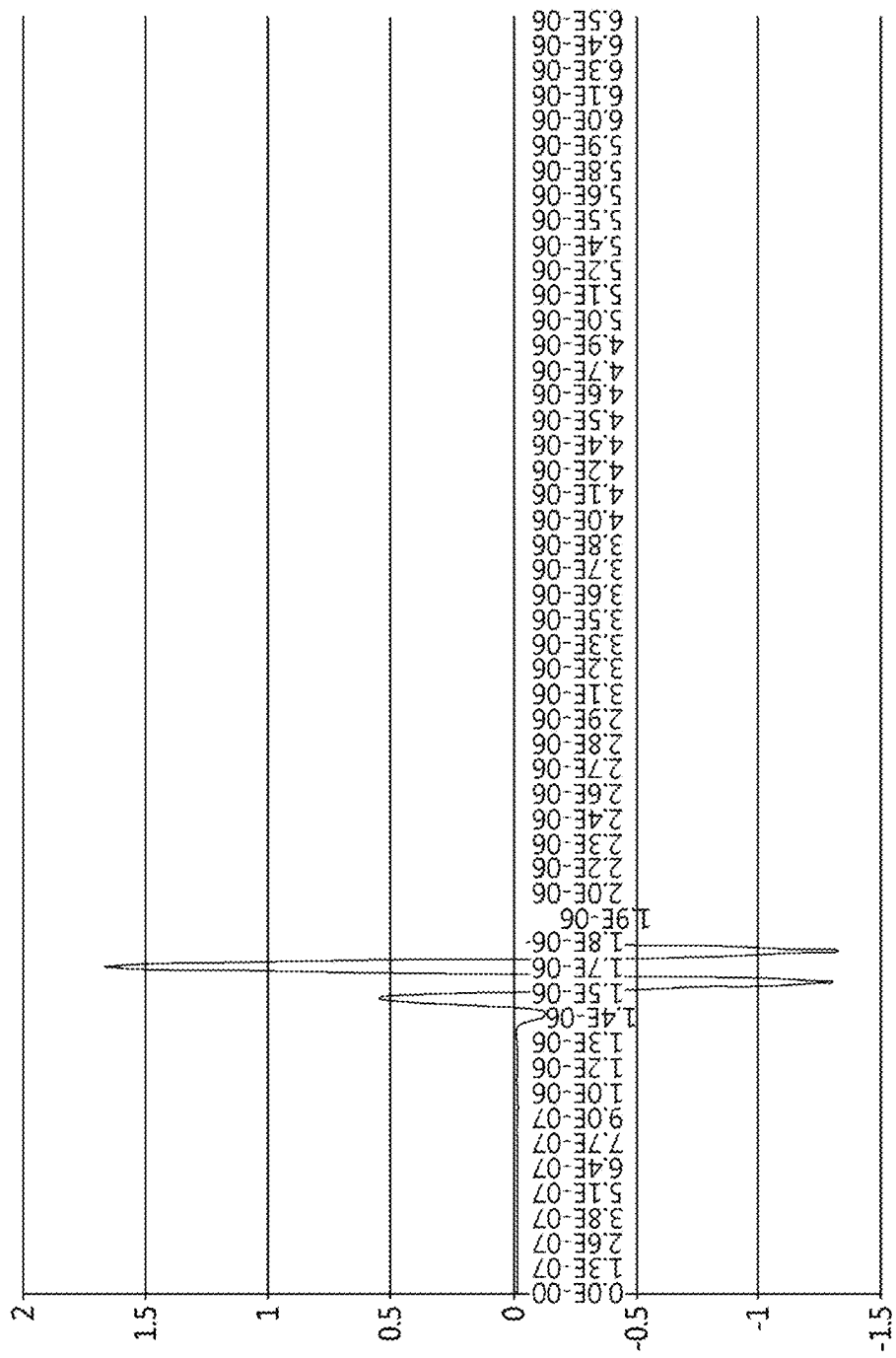
FIG. 2 is a view illustrating an example of a Gaussian enveloped linear chirp signal.

As in equation 1 above, the Gaussian enveloped linear chirp signal has resolution of both the time domain and the frequency domain at the same time, and thus it is possible to design an optimal reference signal according to the propagation characteristics of the underground cable. Accordingly, the optimal reference signal as shown in FIG. 2 may be applied to the corresponding underground cable through a signal generator such as an arbitrary waveform generator (AWG). FIG. 2 is a view illustrating an example of a Gaussian enveloped linear chirp signal.

The Gaussian enveloped linear chirp signal of FIG. 2 represents a case in which the center frequency is 6 MHz, the frequency bandwidth is 6 MHz, and the time width is 480 ns.

In FIG. 2, x-axis and y-axis correspond to time and voltage, respectively. In FIG. 2, time width corresponds to horizontal width of the signal, but since the center frequency and bandwidth are components related to frequency, the time width may be confirmed through conversion of the frequency domain. When the center frequency is increased, the change in the center of the signal becomes faster, and when the bandwidth is increased, a signal with a greater change in frequency is generated.

Meanwhile, the optimal reference signal design unit 110 is to satisfy the following theoretical design conditions in order to design a reference signal having an optimal parameter for each frequency characteristic.

First, the center frequency should be selected considering the attenuation characteristics and resolution for frequency of each cable. Second, the reference signal should minimize signal distortion due to the attenuation characteristics of the cable. Third, the time width should be set on the basis of the uncertainty principle.

In general, when a reference signal is applied to an underground cable, the signal exhibits different attenuation phenomena depending on the frequency band of the cable, but in the case of a signal in the high frequency band, the signal is attenuated more severely due to a skin effect during propagation through the cable.

Accordingly, when the reference signal is designed as a signal having a high center frequency (i.e. a signal in a high frequency band), it might be difficult for the reflected wave of the reference signal reflected at an end to reach the signal application and acquisition unit 120 due to signal attenuation.

On the other hand, when the reference signal is designed as a signal having a center frequency that is too low, the bandwidth of the reference signal is limited, so that a blind spot increases and resolution may decrease. Here, the blind spot means a value obtained by converting a minimum time delay, in which the cross-correlation functions of the reference signal and the reflected wave do not overlap with each other, into a distance.

In the reference signal, the resolution of the time domain and the frequency domain is closely related to the frequency bandwidth. Accordingly, although it is advantageous for the reference signal to increase the frequency bandwidth as much as possible to ensure high resolution, an upper limit inevitably exists in the frequency bandwidth according to the principle of uncertainty that is closely related to the time width.

Accordingly, the optimal reference signal design unit 110 may set the frequency bandwidth and the time width such that a value of a product thereof to be at least 0.5 on the basis of the principle of uncertainty. This is caused by a relation of a tradeoff between the time width and the frequency bandwidth, in which the frequency bandwidth has no way but to be increased when the time width is reduced, and the time width has no way but to be increased when the frequency bandwidth is reduced.

In other words, due to the principle of uncertainty, the frequency bandwidth and time width are not allowed to be reduced together. Therefore, when the frequency bandwidth of the signal is selected as 60 MHz, the time width of the signal is to be selected to be no smaller than about 48 ns by the principle of uncertainty, which may be calculated through equation 2 below.

$$\left(2 \times \pi \times \frac{60 \text{ Mhz}}{6}\right) \times \left(\frac{48 \text{ ns}}{6}\right) \simeq \frac{1}{2} \qquad \text{[Equation 2]}$$

As such, it is important for the optimal reference signal design unit 110 to find an optimal point for designing an optimal reference signal.

This is because the resolution and accuracy of reflected waves (i.e. reflected signals) reflected from the end of the underground cable vary depending on the reference signal (i.e. input signal) applied to the underground cable for detecting the fault location of the underground cable.

That is, the process of detecting the fault location of the underground cable may obtain the best results for the resolution and accuracy of the reflected wave when the time-frequency domain reflectometry method is executed after the optimal reference signal is designed prior to the execution of the time-frequency domain reflectometry method.

Hereinafter, the process in which the optimal reference signal design unit 110 designs the optimal reference signal in consideration of the frequency domain attenuation effect of the underground cable will be described in detail.

First, the time-frequency domain reflectometry method uses a Gaussian enveloped linear chirp signal as a reference signal, and equation 1 above may be expressed as equation 3 below. Equation 1 above corresponds to a theoretical expression, and equation 3 below corresponds to a real part of equation 1. In order to generate an actual signal, a real part signal corresponding to equation 3 below should be designed. Accordingly, the Gaussian enveloped linear chirp signal of the time-frequency domain reflectometry method is represented by equation 3 below.

$$s_k = Ae^{-\frac{(k-m)^2}{2\sigma^2}} \cos\left(\frac{\beta}{2}k^2 + \omega_0 k + \phi_k\right) \qquad \text{[Equation 3]}$$

Here, A represents a magnitude of the signal, δ represents an angular frequency increase rate, $\omega_0$ represents a center angular frequency, m represents a time center of the reference signal, $\sigma^2$ represents a time width adjustment parameter, and $\Phi_k$ represents a phase.

The Gaussian enveloped linear chirp signal may be designed using parameters of A, β, $\omega_0$, σ, and m, which are designable parameters. Here, the time width is proportional to σ, and the frequency bandwidth is made through a combination of β and σ. The center frequency corresponds to $\omega_0$.

The optimal reference signal design unit 110 sets the center frequency, frequency bandwidth, and time width, which are design parameters, of the Gaussian enveloped linear chirp signal on the basis of the analysis results of the frequency attenuation characteristics of the underground cable.

Figure 3:
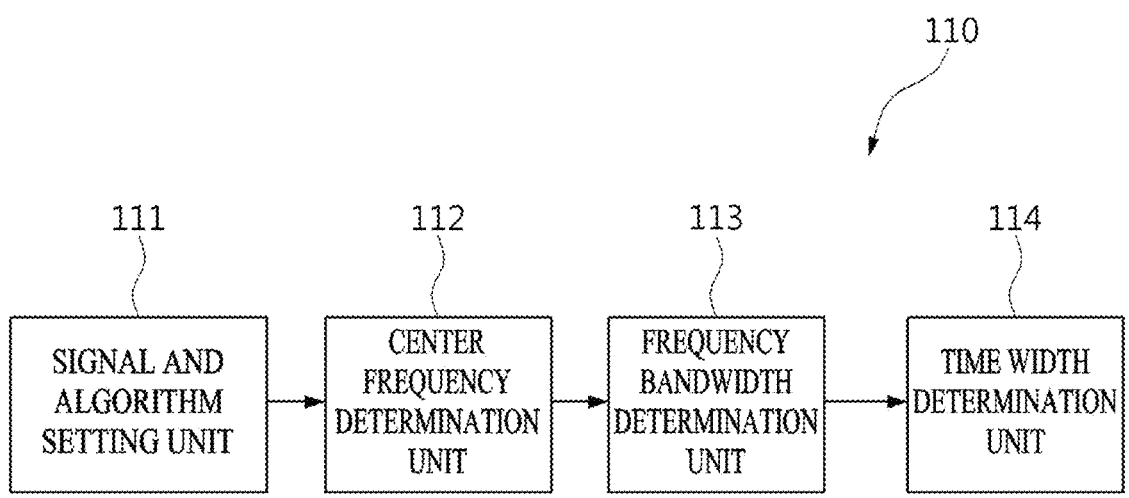
FIG. 3 is a view illustrating a detailed configuration of an optimal reference signal design unit of FIG. 1.

With reference to FIG. 3, the optimal reference signal design unit 110 is configured to include a signal and algorithm setting unit 111, a center frequency determination unit 112, a frequency bandwidth determination unit 113, and a time width determination unit 114. FIG. 3 is a view illustrating a detailed configuration of an optimal reference signal design unit of FIG. 1.

The signal and algorithm setting unit 111 sets signal information necessary to design a reference signal for detecting a fault location of the underground cable. Here, the signal information corresponds to a sampling rate, a point size, and an average number of a signal.

In addition, the signal and algorithm setting unit 111 sets detailed algorithm information of the time-frequency domain reflectometry method. At this time, the signal and algorithm setting unit 111 may determine an appropriate algorithm according to the line length and noise environment of the underground cable. Here, the algorithm information corresponds to a fast Fourier transform (FFT) size, a reference signal channel, and the like.

The center frequency determination unit 112 determines the center frequency of the reference signal. As mentioned above, as the center frequency of the reference signal increases, the signal attenuation increases, so the size of the reflected wave may be reduced.

Accordingly, in order to determine the optimal center frequency, the center frequency determination unit 112 first identifies the maximum center frequency through the endpoint check and then checks the change in the size of the cross-correlation function according to the change in the center frequency, thereby selecting a predetermined number of center frequency candidate group eligible as the optimal center frequency. This is because the center frequency affects the next procedure in which the frequency bandwidth and time width are determined.

For example, when the center frequency is increased from 50 MHz to 70 MHz, the reference signal is further subjected to be influenced of attenuation phenomenon, and the size of the reflected wave becomes to be reduced. That is, the 50 MHz signal detects the endpoint as a larger cross-correlation function value compared to the 70 MHz signal. However, since the center frequency determines the upper limit of the frequency bandwidth, there is a possibility that the target resolution may not be obtained when a low value is selected. Accordingly, the center frequency determination unit 112 selects a predetermined number of center frequency candidate group capable of checking the endpoint.

The frequency bandwidth determination unit 113 determines the frequency bandwidth of the reference signal.

At this time, the frequency bandwidth determination unit 113 determines the optimal bandwidth by changing the frequency bandwidth after fixing the center frequency candidate group and the appropriate time width.

The frequency bandwidth is related to the resolution of the reflected wave in the time-frequency domain reflectometry method, and the limit of the frequency bandwidth is determined by the center frequency candidate group determined by the center frequency determination unit 112. In addition, when the frequency bandwidth is wide, distortion of the reference signal may become severe due to attenuation and dispersion effects of signals for each frequency.

Accordingly, the frequency bandwidth determination unit 113 determines the optimal frequency bandwidth by checking the change in the magnitude of the cross-correlation function according to the change in the frequency bandwidth.

When the center frequency was previously selected as a candidate group of about 55 MHz to 65 MHz, the frequency bandwidth may be increased up to 110 MHz for the center frequency of 55 MHz and up to 130 MHz for the center frequency of 65 MHz. The larger the frequency bandwidth, the higher the resolution, but the distortion of the signal becomes severe, so the detection performance may decrease. Therefore, the frequency bandwidth determination unit 113 observes the cross-correlation function and becomes to determine an optimal frequency bandwidth indicating a high value.

The time width determination unit 114 determines the time width of the reference signal.

At this time, after fixing the optimal center frequency candidate group and the optimal frequency bandwidth, the time width determination unit 114 determines the optimal time width by checking the change in the magnitude of the cross-correlation function according to the change in time width.

The time width determination unit 114 selects an optimal time width by changing the energy of the entire signal. This is to prevent the reflected wave and the reference signal from overlapping each other in the time domain.

That is, as the time width increases, the energy of the signal increases. This may bring an effect that the detection result becomes better, but when the time width becomes large, the reflected wave and the reference signal overlap each other in the time domain, which may adversely affect resolution. Therefore, the time width determining unit 114 should select an appropriate time width in consideration of the two matters.

Finally, for the case of the time width, the time width is determined through a cross-correlation function while being changed within a range that does not violate the principle of uncertainty. For example, when it was previously determined the center frequency to be 60 MHz and the frequency bandwidth to be 60 MHz, the time width determination unit 114 increases the time width starting at a minimum of 48 ns, thereby selecting the optimal time width while observing the result.

As such, the optimal reference signal design unit 110 may design an optimal reference signal in consideration of propagation characteristics of the underground cable as the center frequency, frequency bandwidth, and time width of the reference signal are determined.

After generating an optimal reference signal designed by the optimal reference signal design unit 110 and applying the optimal reference signal to the underground cable, the signal application and acquisition unit 120 acquires a reflected signal, for the reference signal applied to the underground cable, from the underground cable.

Figure 4:
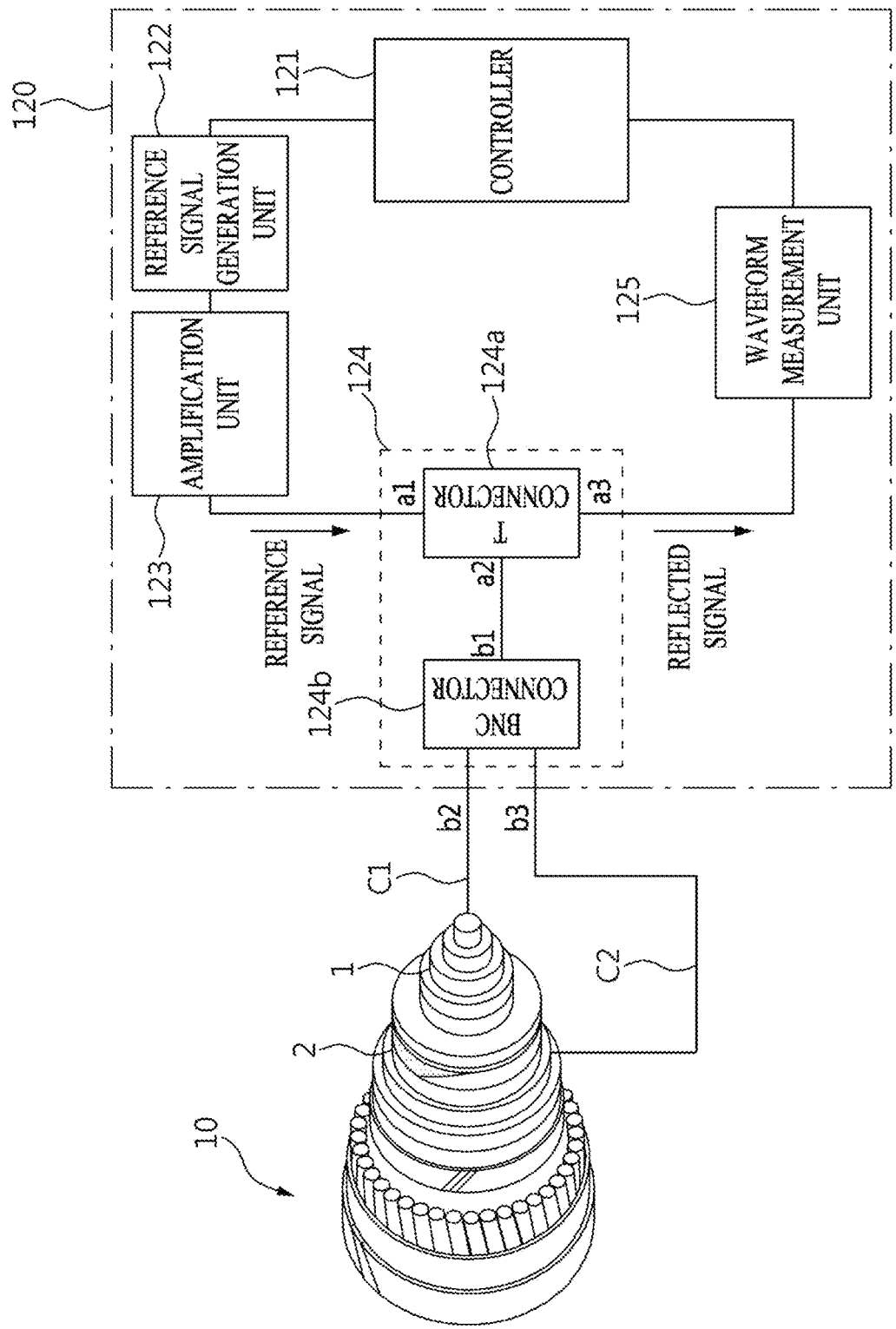
FIG. 4 is a view illustrating a detailed configuration of a signal application and acquisition unit of FIG. 1.

With reference to FIG. 4, the signal application and acquisition unit 120 is configured to include a controller 121, a reference signal generation unit 122, an amplification unit 123, an underground cable connection unit 124, and a waveform measurement unit 125. FIG. 4 is a view illustrating a detailed configuration of a signal application and acquisition unit of FIG. 1, The controller 121 transmits a control instruction to the reference signal generator 122, for generating an optimal reference signal according to the center frequency, frequency bandwidth, and time width of the optimal reference signal designed by the optimal reference signal design unit 110.

At this time, the reference signal generation unit 122 generates an optimal reference signal, thereby applying the optimal reference signal to the underground cable 10 through the underground cable connection unit 124.

Here, because the signal attenuation may occur depending on the reference signal frequency band in the case of the long-distance underground cable 10, the amplification unit 123 amplifies the optimal reference signal generated by the reference signal generation unit 122, thereby applying the optimal reference signal to the underground cable 10 through the underground cable connection unit 124. This is to improve the resolution and accuracy of the reflected signal when applying the time-frequency domain reflectometry method. Accordingly, the amplification unit 123 may not operate in the case of the short-distance underground cable 10.

The controller 121 and the reference signal generation unit 122 may communicate with each other through a general purpose interface bus (GPIB).

The underground cable connection unit 124, one end of which is connected to the reference signal generation unit 122 or the amplification unit 123, transfers the optimal reference signal, applied from the reference signal generation unit 122 or the amplification unit 123, to a conductor layer 1 of the underground cable 10. That is, the optimal reference signal moves along a path leading to the reference signal generation unit 122, the amplification unit 123, the underground cable connection unit 124, and the conductor layer 1 of the underground cable 10.

In addition, the underground cable connection unit 124, an opposite end of which is connected to the waveform measurement unit 125, transfers the reflected signal received from the metal sheath layer 2 of the underground cable 10 to the waveform measurement unit 125.

At this time, the underground cable connection unit 124 is configured by connecting a T connector 124*a* and a BNC connector 124*b* in series. Here, a first terminal a1 of the T connector 124*a* is connected to the reference signal generation unit 122 or the amplification unit 123, a second terminal a2 of the T connector 124*a* is connected to a first terminal b1 of the BNC connector 124*b*, and a third terminal a3 of the T connector 124*a* is connected to the waveform measurement unit 125.

In addition, the second terminal b2 of the BNC connector 124*b* is a (+) terminal and connected to the conductor layer 1 of the underground cable 10, and the third terminal b3 of the BNC connector 124*b* is a (−) terminal and is connected to the metal sheath layer 2 of the underground cable 10.

A measurement cable C1, to which the second terminal b2 of the BNC connector 124*b* and the conductor layer 1 of the underground cable 10 are connected, and a measurement cable C2, to which the third terminal b3 of the BNC connector 124*b* and the metal sheath layer 2 of the underground cable 10 are connected should be of the same type and length.

Since the reference signal frequency band is high when the underground cable 10 is a short-distance, an influence of the measurement cables C1 and C2 may be large. In this case, the measurement cables C1 and C2 may minimize the influence of the cables themselves through impedance matching.

The waveform measurement unit 125 measures the reflected signal transferred from the underground cable connection unit 124. At this time, the waveform measurement unit 125 is able to measure not only the reflected signal but also the reference signal and provides the measurement result to the controller 121.

The controller 121 and the waveform measurement unit 125 may communicate with each other through the general purpose interface bus (GPIB).

Meanwhile, a distance to the fault location is finally determined through a cross-correlation function between the reference signal and the reflected signal which are mentioned in the optimal reference signal design.

The data analysis unit 130 analyzes data (that is, acquisition data for reference signals and reflected signals) acquired by the signal application and acquisition unit 120 in a time domain and a frequency domain.

Figure 5:
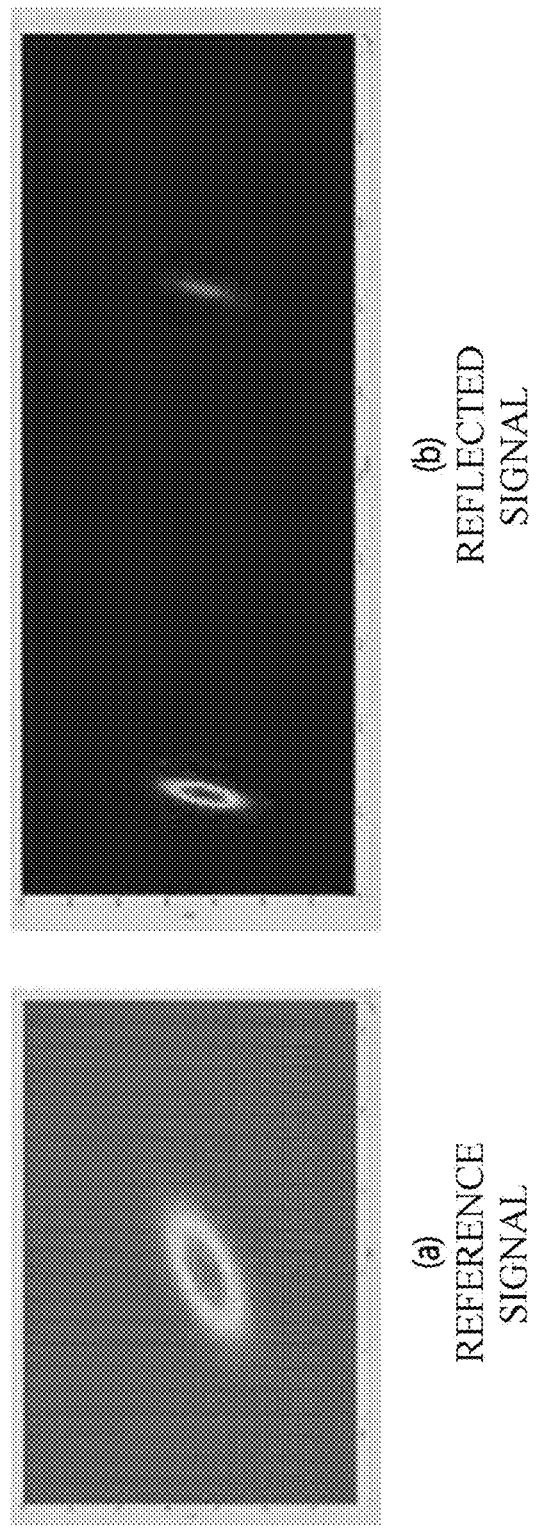
FIG. 5 shows views illustrating energy distributions in a time-frequency domain of a reference signal and a reflected signal, respectively.

First, the data analysis unit 130 obtains a time-frequency domain energy distribution for the reference signal and the reflected signal acquired through a Wigner-Ville distribution. That is, after calculating the energy distribution of the reflected signal and the energy distribution of the reference signal (see FIG. 5), the data analysis unit 130 decides the similarity between the two signals and estimates whether a fault location of the underground cable exists. FIG. 5 shows views illustrating energy distributions in a time-frequency domain of a reference signal and a reflected signal, respectively.

Here, the energy distribution for each time-frequency of the non-stationary signal is expressed by the Wigner-Ville distribution function as shown in equation 4 below.

$$W(t, \omega) = \frac{1}{2\pi}\int_{-\infty}^{\infty} s^*\left(t - \frac{1}{2}\tau\right)s\left(t + \frac{1}{2}\tau\right)e^{-j\omega\tau}d\tau \quad \text{[Equation 4]}$$

As such, for detecting the fault location of the underground cable, the data analysis unit 130 obtains the time-frequency domain energy distributions for the reference signal and the reflected signal and then checks the correlation of both signals using the cross-correlation function of the time-frequency domain.

Here, the cross-correlation function of the time-frequency domain is used to decide the similarity of the time-frequency domain energy distribution for the reference signal and the reflected signal, and obtains a normalized value between zero and one. At this time, the value of the normalized cross-correlation function represents a probabilistic meaning indicating whether a fault location exists.

In addition, the correlation of the time-frequency domain energy distribution of the two signals is expressed as a cross-correlation function of the two signals as in equation 5 below.

$$C_{s\gamma}(t) = \frac{1}{E_s E_\gamma(t)} \int_{t'=t-T_s}^{t'=t+T_s} W_\gamma(t', \omega) W_s(t'-t, \omega) d\omega dt' \quad \text{[Equation 5]}$$

Here, $W\gamma$ (t, $\omega$) is the time-frequency domain energy distribution of the reflected signal, Ws (t, $\omega$) is the time-frequency domain energy distribution of the reference signal, and $E\gamma sE\gamma$ (t) is a normalized value in order to represent the value of the cross-correlation function in a value between zero and one.

Therefore, the data analysis unit 130 may detect a local impedance change point by the presence or absence, a magnitude, a peak distance, and the like of the value of the cross-correlation function.

On the other hand, as described above, the data analysis unit 130 follows the time-frequency domain reflectometry processing method for detecting the fault location of the underground cable and uses the Wigner-Ville distribution to analyze the time-frequency domain energy distribution of the reference signal and the reflected signal, in the time-frequency domain.

However, since the Wigner-Ville distribution has a cross-term between the reference signal (incident signal) and the reflected signal (reflected wave), distortion may occur in signal analysis. Since the cross-term is created through the calculation of the reference signal and the reflected signal, similarity with the reference signal exist in the cross-term.

Figure 6:
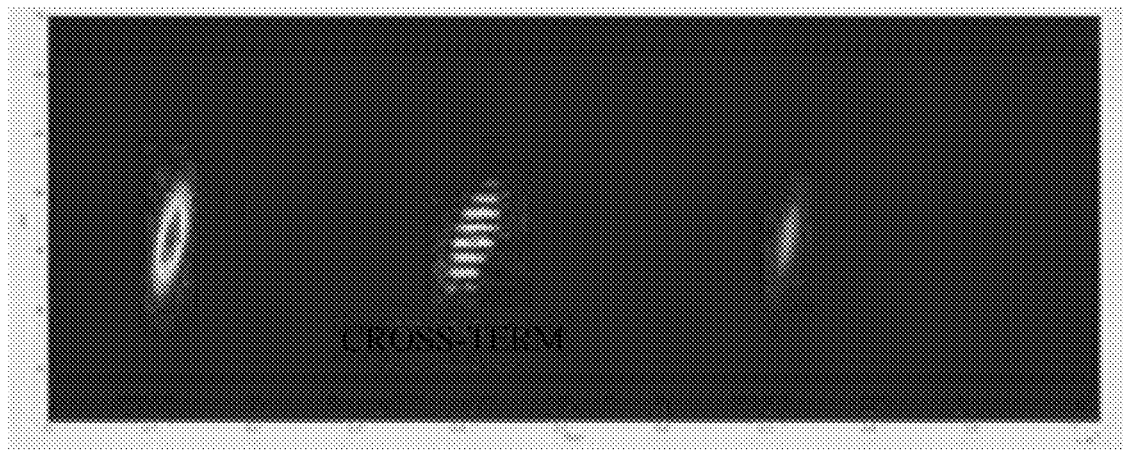
FIG. 6 is a view illustrating a cross-term of Wigner-Ville distribution.

With reference to FIG. 6, the cross-term exists at an arithmetic mean position between the reference signal and the reflected signal and has a unique pattern in which positive and negative components repeat. For this reason, the cross-term may be mistaken for a fault location. FIG. 6 is a view illustrating a cross-term of the Wigner-Ville distribution.

However, when calculating the correlation function through the Wigner-Ville distribution of the entire reference signal (incident signal), the data analysis unit 130 uses a signal processing technique using a moving window.

Figure 7:
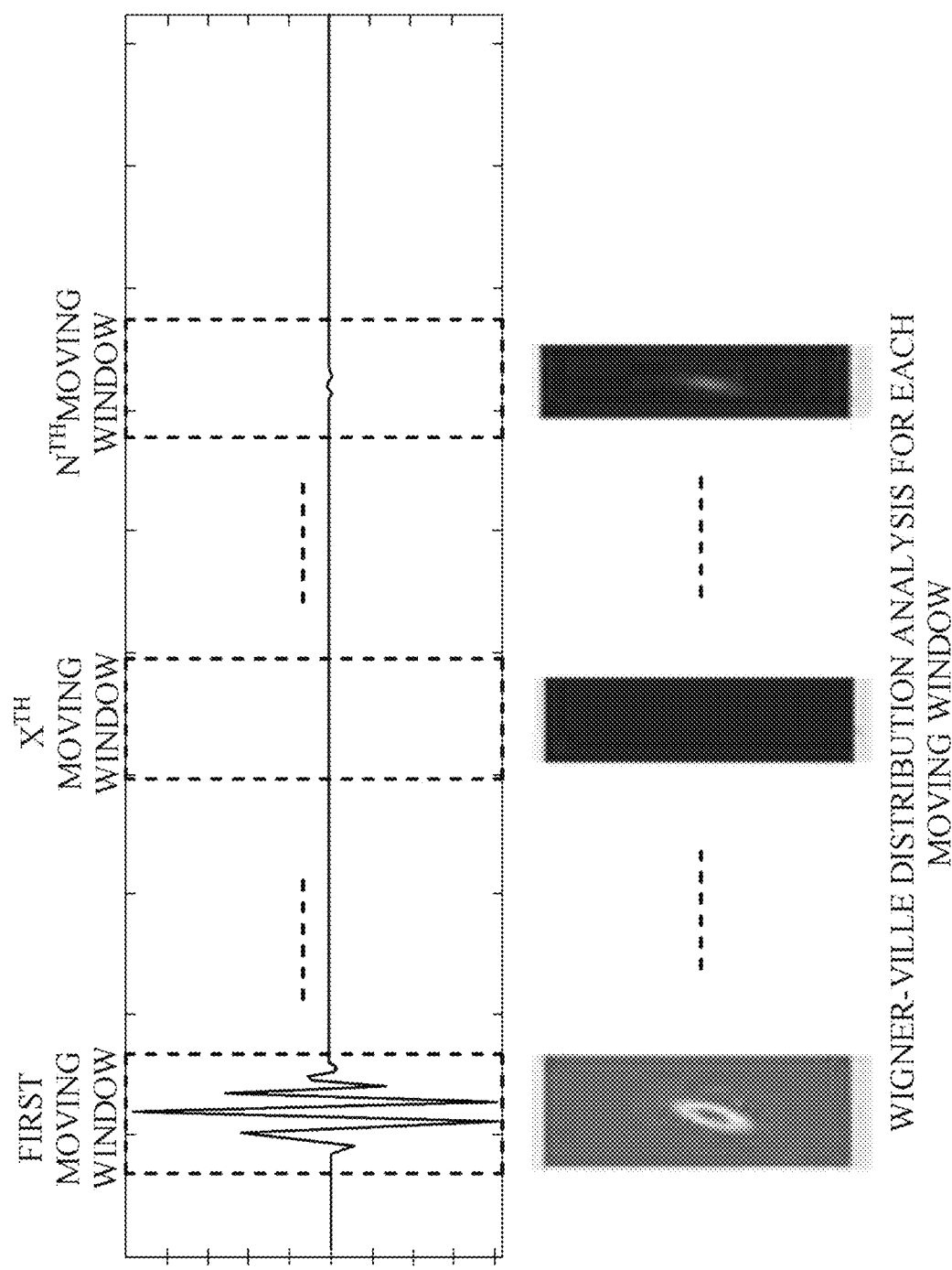
FIG. 7 shows views illustrating a process of calculating a localized Wigner-Ville distribution.

With reference to FIG. 7, the data analysis unit 130 first selects a signal, as much as corresponding to the reference signal, as the first signal, calculates the Wigner-Ville distribution, and then continuously calculates the Wigner-Ville distribution through movement as much as a unit sample. The method described above utilizes the concept of a localized Wigner-Ville distribution for as much as a specific section and is capable of completely removing the cross-term that causes performance degradation in the existing Wigner-Ville distribution. That is, the data analysis unit 130 analyzes the localized Wigner-Ville distribution for calculating the Wigner-Ville distribution for each moving window. FIG. 7 shows views illustrating a process of calculating the localized Wigner-Ville distribution.

Figure 8:
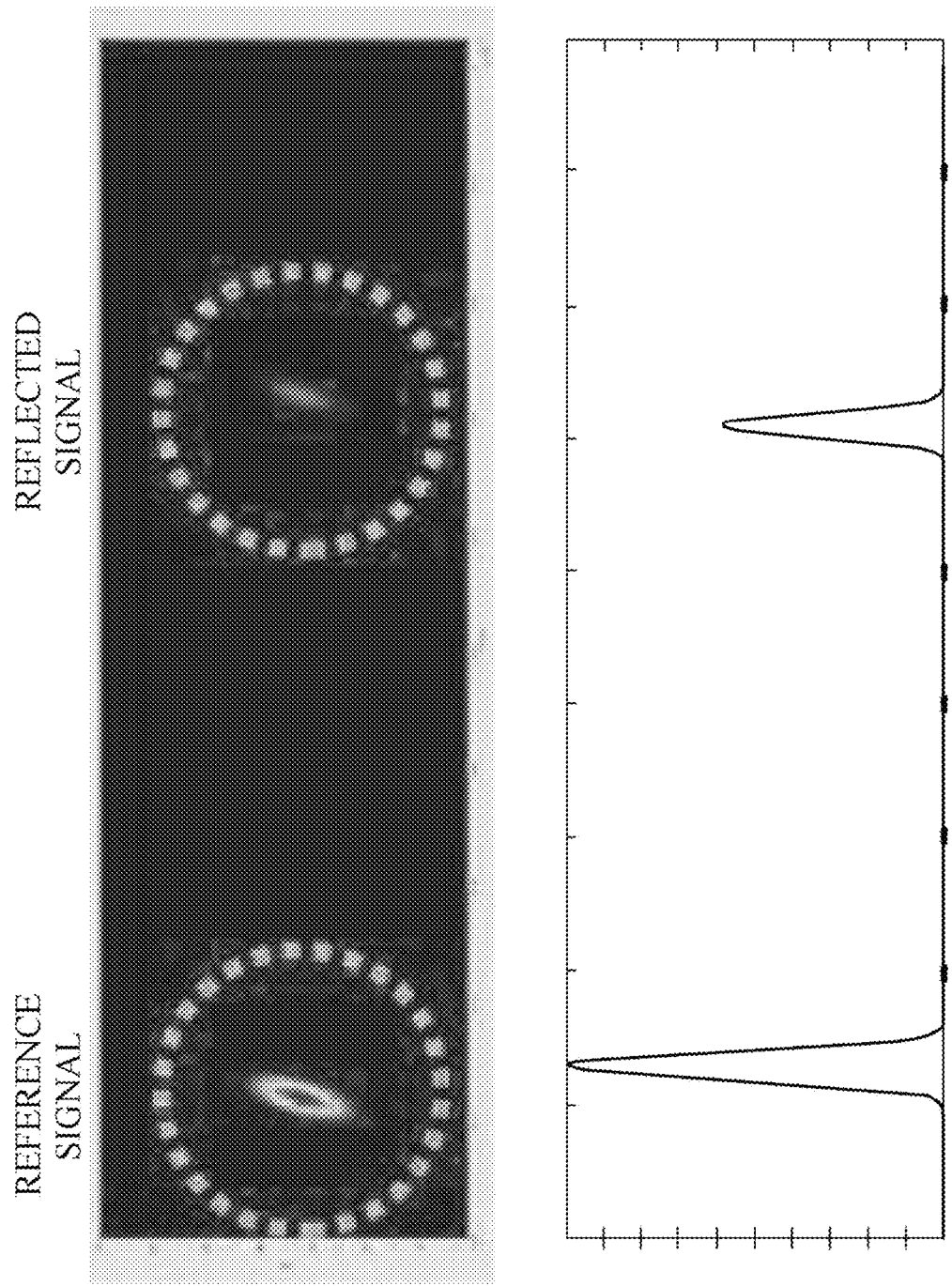
FIG. 8 shows views illustrating a cross-correlation function of time-frequency in which the cross-term is removed.

As shown in FIG. 8, the data analysis unit 130 may detect a fault location of the underground cable by analyzing a cross-correlation function of the time-frequency in which cross-term is removed from the Wigner-Ville distribution. FIG. 8 shows views illustrating the cross-correlation function of time-frequency in which the cross-term is removed.

The user interface unit 140 provides a user interface environment (graphic user interface (GUI)) in conjunction with the optimal reference signal design unit 110, the signal application and acquisition unit 120, and the data analysis unit 130.

Figure 9:
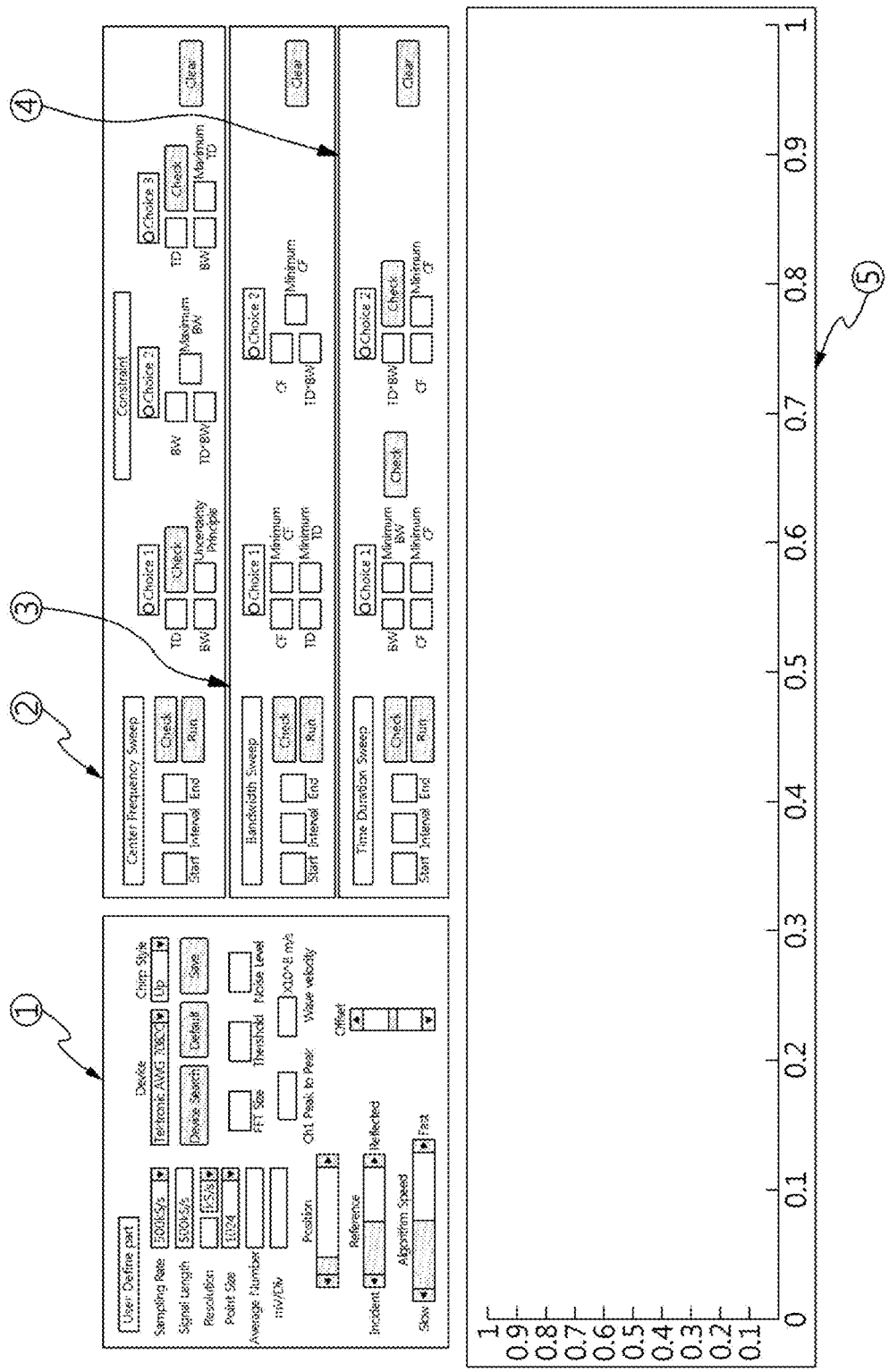
FIG. 9 is a view illustrating an optimal reference design GUI.

Specifically, the user interface unit 140 provides an optimal reference design GUI 140-1, as shown in FIG. 9, as the GUI for progressing an optimal reference signal design according to the time-frequency domain reflectometry method in conjunction with the optimal reference signal design unit 110. FIG. 9 is a view illustrating the optimal reference design GUI.

With reference to FIG. 9, the optimal reference design GUI 140-1 provides the GUI for a series of determination processes for the center frequency, frequency bandwidth, and time width for designing an optimal reference signal.

To this end, the optimal reference design GUI 140-1 provides a signal generation and algorithm setting function ①, a center frequency determination function ②, a frequency bandwidth determination function ③, a time width determination function ④, and a graph expression function ⑤ of correlation function by design signals.

In addition, the user interface unit 140 provides a signal application and acquisition GUI 140-2 as the GUI displaying measurement results for the reference signal and the reflected signal according to the time-frequency domain reflectometry method in conjunction with the signal application and acquisition unit 120. At this time, the signal application and acquisition GUI 140-2 may be provided as included in the fault location detection GUI 140-3 to be described later.

Figure 10:
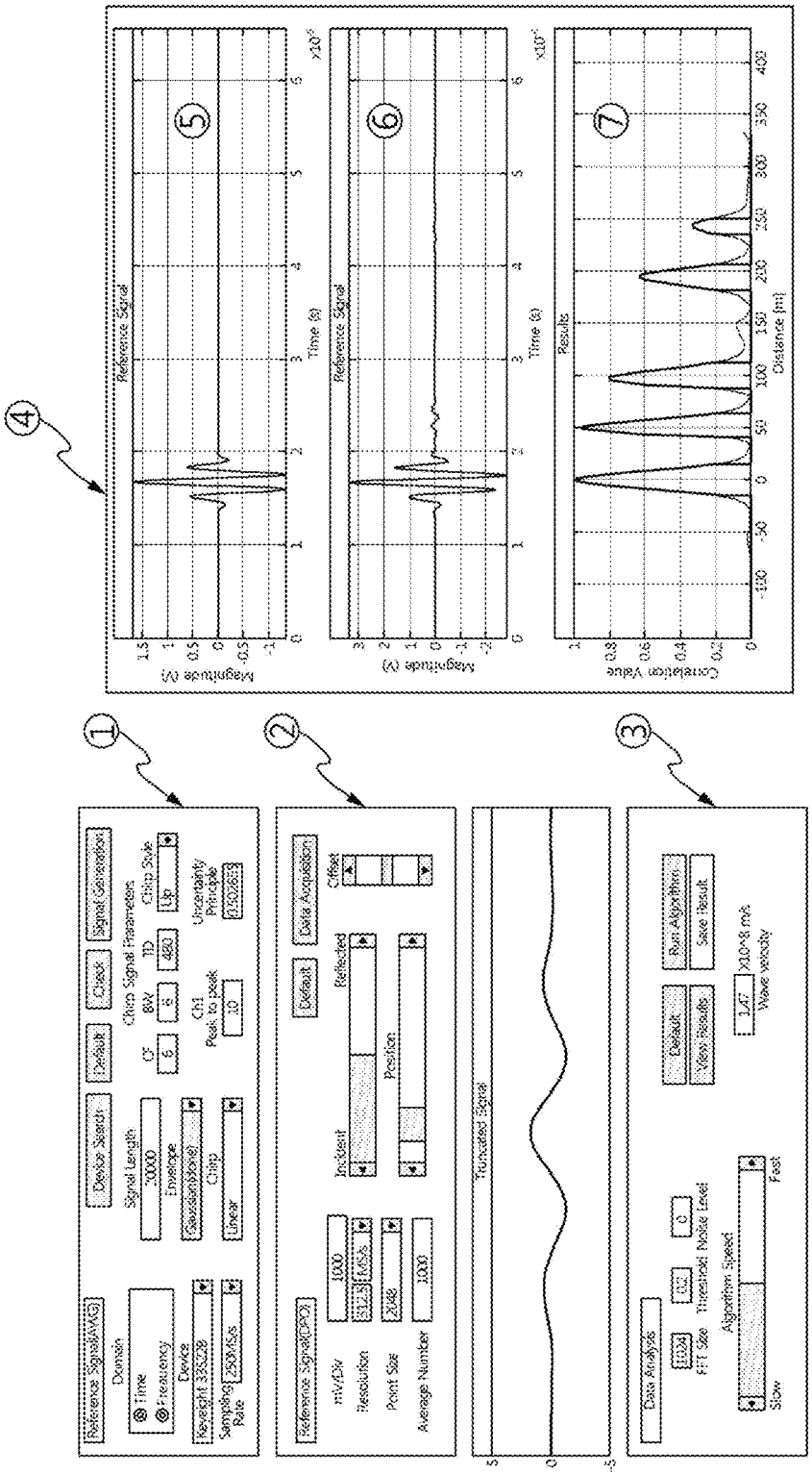
FIG. 10 is a view illustrating a fault location detection GUI.

On the other hand, the user interface unit 140 provides a fault location detection GUI 140-3, as shown in FIG. 10, as the GUI displaying a process of detecting a fault location of the underground cable according to the time-frequency domain reflectometry method in conjunction with the data analysis unit 130. FIG. 10 is a view illustrating a fault location detection GUI.

With reference to FIG. 10, the fault location detection GUI 140-3 provides the GUI for a series of processes for detecting a fault location of an underground cable.

To this end, the fault location detection GUI 140-3 provides a signal generation and algorithm setting function ①, a waveform measurement control function ②, a data analysis control function ③, and a waveform analysis function ④.

The signal generation and algorithm setting function ① provides a function to input the center frequency, bandwidth, and time width of the reference signal applied to the underground cable, and to set the sampling rate, length of the signal, and the like, thereby controlling the signal generator. At this time, the signal generation and algorithm setting function ①, as a fault location detection algorithm, may detect the fault location of the underground cable using the existing algorithm by setting the existing TDR method.

The waveform measurement control function ② provides a function to control the waveform instrument by setting the division level, resolution, point size, and an average number of a signal, of the waveform instrument.

The data analysis control function ③ provides a function capable of determining the magnitude of the FFT associated with a detailed algorithm of time-frequency domain reflectometry method. At this time, the data analysis control function ③ also provides even functionality of controlling the final result waveform ⑦ in which the fault distance defined by the cross-correlation function of the reference signal ⑤ and the reflected signal ⑥, in the waveform analysis function ④, is expressed.

In addition, the data analysis control function ③ is responsible for a function of inputting the default value of the propagation speed necessary for calculating the fault location, and is also responsible for a function of storing numerical data of all waveforms displayed in the waveform analysis function ④.

The waveform analysis function ④ shows the reference signal ⑤ and the reflected signal ⑥, measured by the waveform meter, and the final result waveform ⑦ in which the fault location, calculated by the cross-correlation function of the reference signal and the reflected signal, is expressed.

Figure 11:
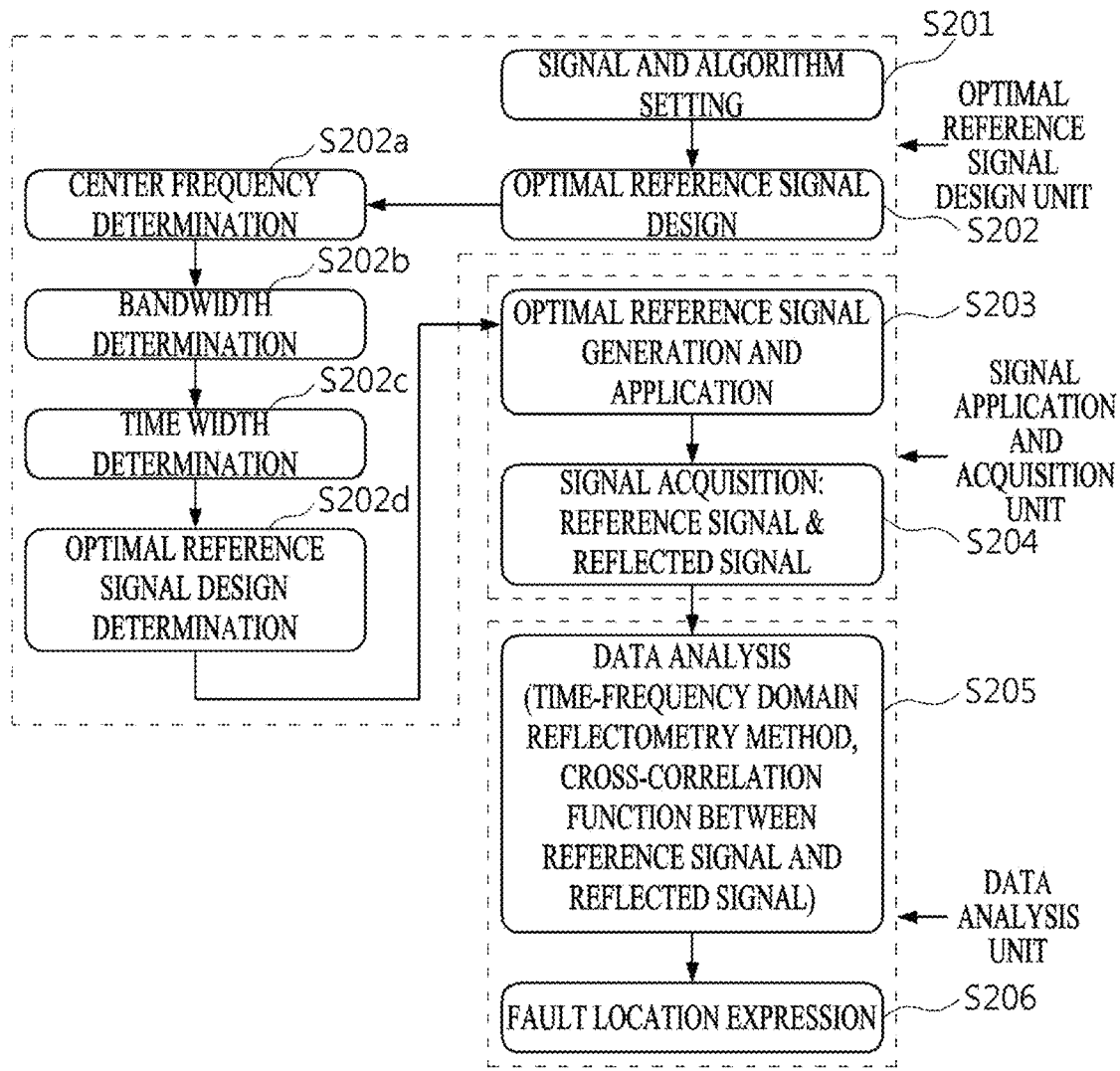
FIG. 11 is a view illustrating a method for detecting a fault location of the underground cable according to an embodiment of the present invention.

FIG. 11 is a view illustrating a method for detecting a fault location of the underground cable according to an embodiment of the present invention.

As the time-frequency domain reflectometry method is applied when detecting the fault location of the underground cable, the optimal reference signal design unit 110 designs the input signal, that is, the optimal reference signal, applied to the underground cable considering the propagation characteristics of the underground cable. In this case, the optimal reference signal design unit 110 selects three elements (i.e. center frequency, frequency bandwidth, and time width) of the reference signal in values optimized for the underground cable, which is to be an object, thereby designing the optimal reference signal.

First, the optimal reference signal design unit 110 sets data for generating a reference signal, such as a sampling rate of a signal, from which a reference signal is to be acquired, a length of a signal, a point size, an average number of a signal, and the like and sets a FFT size and a reference signal channel determination, and the like associated with the detailed algorithm of the time-frequency domain reflectometry method at S201.

Thereafter, the optimal reference signal design unit 110 designs an optimal reference signal at S202. Specifically, the optimal reference signal design unit 110 performs a center frequency determination process for determining the center frequency candidate group of the reference signal at S202a, a frequency bandwidth determination process of the reference signal at S202b, and a time width determination process of the reference signal at S202c.

As such, the optimal reference signal design unit 110 may design an optimal reference signal for detecting a fault location for an underground cable.

Next, the signal application and acquisition unit 120 generates a reference signal (analog signal) using three elements (i.e. center frequency, frequency bandwidth, and time width) of the reference signal designed by the optimal reference signal design unit 110, thereby applying the optimal reference signal to the underground cable, which is an object to be diagnosed, at S203. At this time, the applied optimal reference signal is propagated along the underground cable.

Thereafter, the signal application and acquisition unit 120 acquires the reflected signal of the applied reference signal from the impedance discontinuity point in the underground cable at S204. At this time, the signal application and acquisition unit 120 also acquires even the applied reference signal.

Next, the data analysis unit 130 analyzes the obtained data acquired according to the time-frequency domain reflectometry method at S205. At this time, the data analysis unit 130 obtains a time-frequency domain energy distribution for the reference signal and the reflected signal acquired through the Wigner-Ville distribution, and estimates whether a fault location exists by deciding the similarity between the two signals. The data analysis unit 130 uses a cross-correlation function of the time-frequency domain to decide the similarity between the two signals. Here, the cross-correlation function obtains a normalized value between zero and one, and the value of the normalized cross-correlation function represents a probabilistic meaning indicating whether a fault location exists.

As described above, the data analysis unit 130 uses a time-frequency domain reflectometry method for detecting a fault location of the underground cable, and uses a Wigner-Ville distribution for time-frequency domain analysis.

However, since the cross-term exists between the reference signal and the reflected signal, when performing the analysis using the Wigner-Ville distribution, the data analysis unit 130 performs time-frequency domain analysis without the cross-term through a localized Wigner-Ville distribution for as much as a specific section.

Subsequently, the data analysis unit 130 performs a fault location expression process of detecting a fault location of the underground cable through time-frequency domain analysis at S206 as described above.

Figure 12:
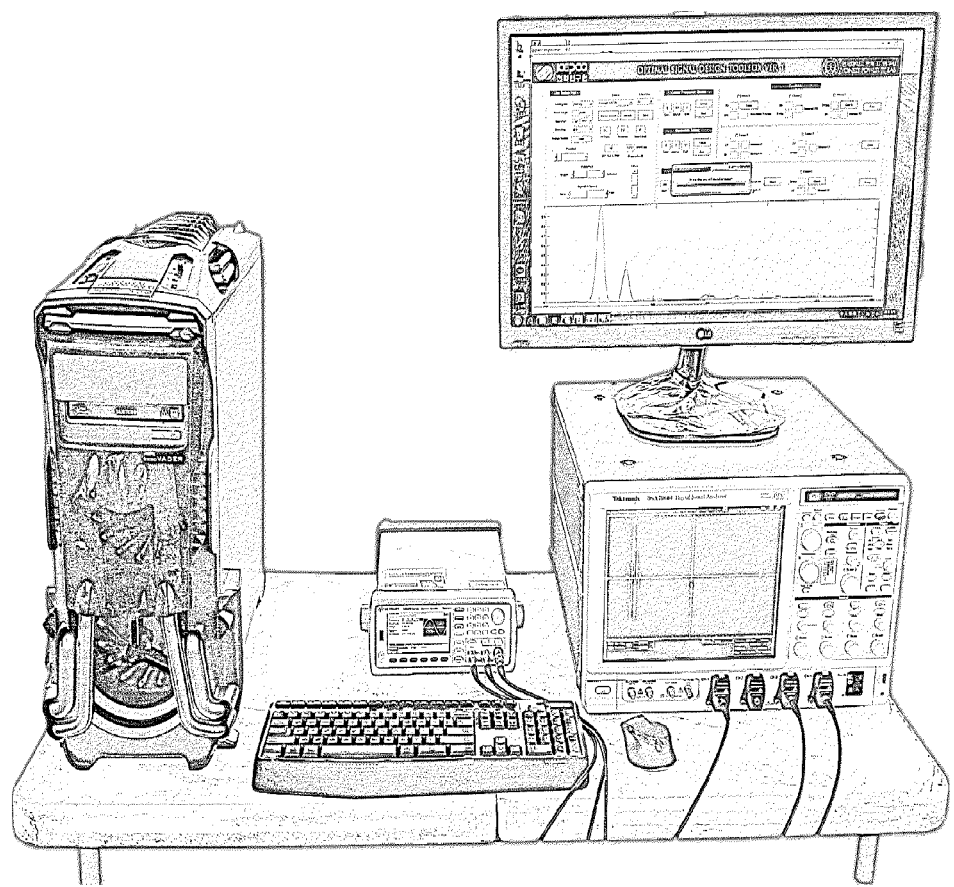
FIGS. 12 and 13 are views illustrating a facility and a result, respectively, of a verification test performed in a verification test site.
Figure 13:
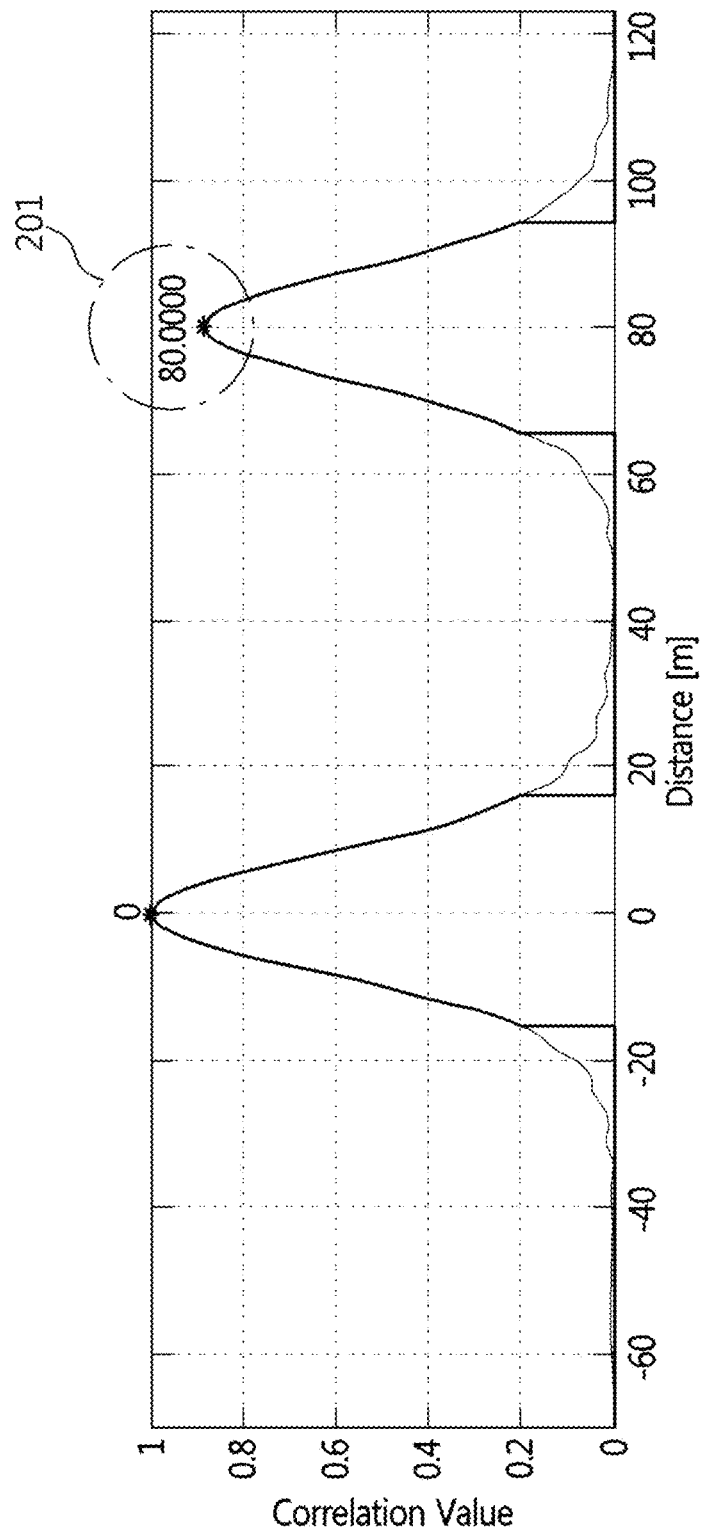

FIGS. 12 and 13 are views illustrating a facility and a result, respectively, of a verification test performed in a verification test site.

The verification test is a test for validation of the fault location detection apparatus 100 that detects the fault location of the underground cable using the time-frequency domain reflectometry method.

The underground cable, which is the object of the verification test, was a 800 mm² MI cable, the same kind of a ±180 kV HVDC cable used between Jeju and Haenam and had a length of 80 m.

In the verification test as shown in FIG. 12, the center frequency, bandwidth, and time width of the optimal reference signal were selected through experiments. The selected center frequency was 6 MHz, the frequency bandwidth was 6 MHz, and the time width was 480 ns.

The MI cable, which was the object cable, had the total length of 80 m and was installed through a sea bed section of as much as by 36 m, and the end point was calculated through the time-frequency domain reflectometry method.

FIG. 13 shows the result that calculated the end point through the time-frequency domain reflectometry method, wherein the result shows 80 m of the length 201 of the end point is accurately predicted when the propagation speed of the MI cable is $1.4741 \times 10^8$ m/s.

Figure 14:
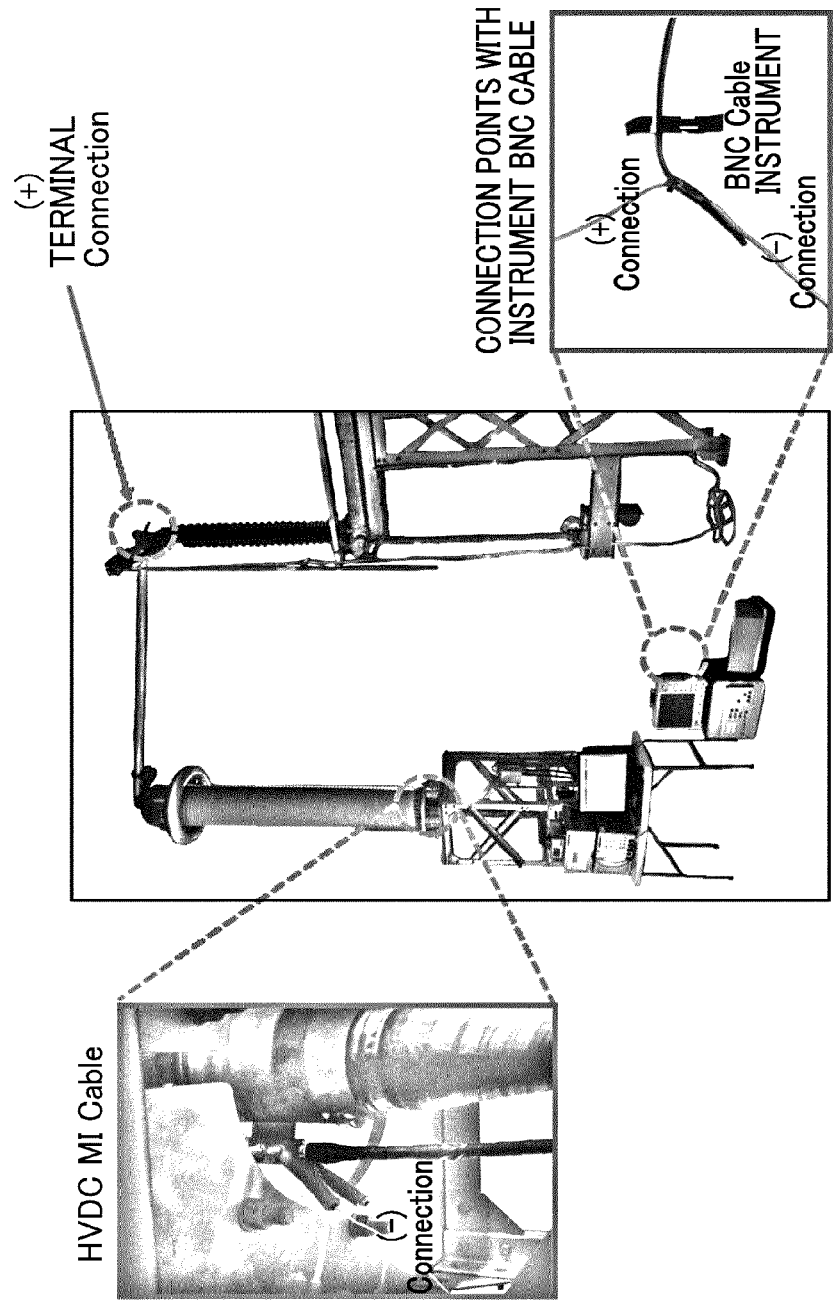
FIGS. 14 and 15 are views illustrating a facility and a result, respectively, of the verification test performed for ±250 kV Jindo-Jeju HVDC cable.
Figure 15:
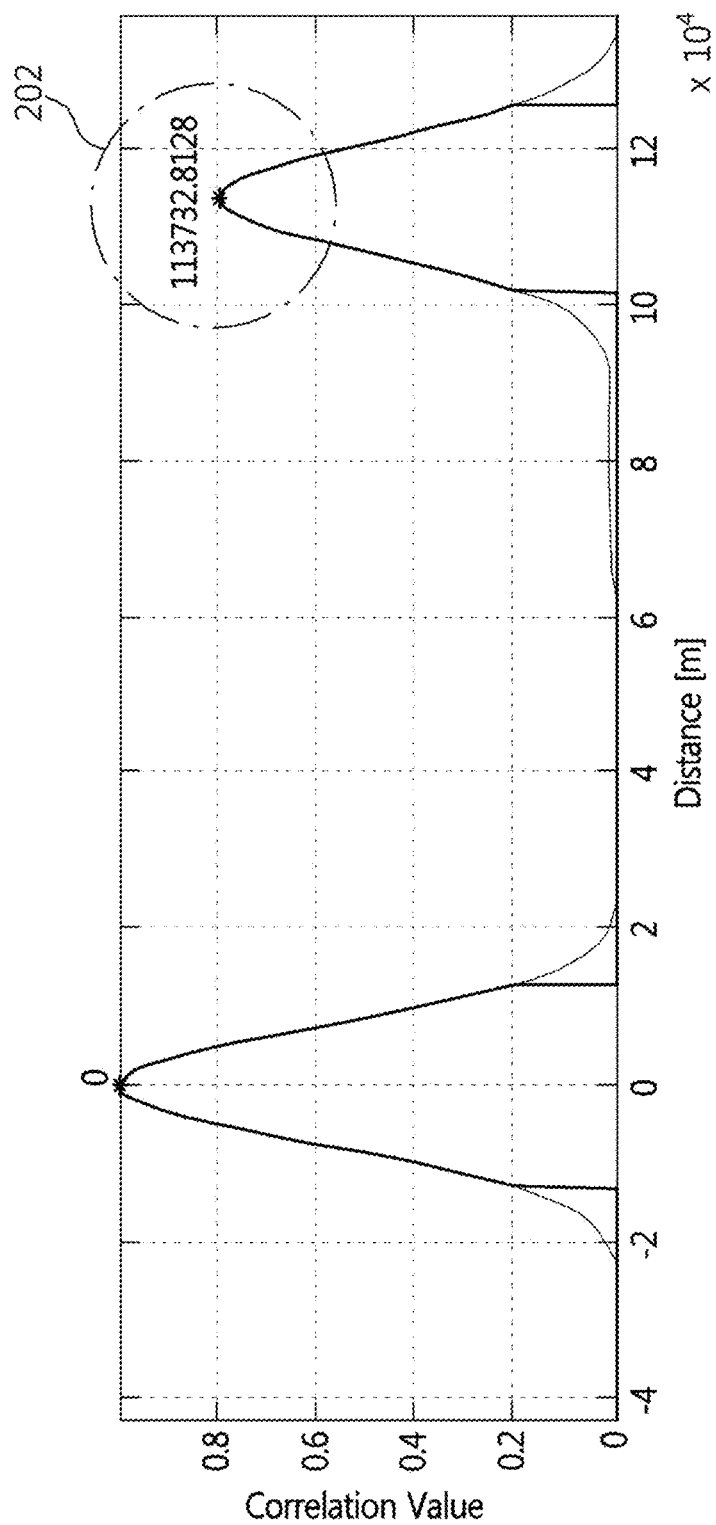

FIGS. 14 and 15 are views illustrating a facility and a result, respectively, of the verification test performed for a ±250 kV Jindo-Jeju HVDC cable.

FIGS. 14 and 15 show the facility and the result, respectively, of the verification test executed for the ±250 kV HVDC cable between Jindo and Jeju. The HVDC submarine cable between Jindo and Jeju uses a cable of MI 900 mm², and the total line length is 113 km.

FIG. 14 shows a verification test process, and in order to design an optimal reference signal of the time-frequency domain reflectometry method, the optimal reference signal was designed through sequential observation of the cross-correlation function in the order of selection of the center frequency, frequency bandwidth, and time width. Here, an optimal reference signal having center frequency of 5 kHz, frequency bandwidth of 9.5 kHz, and time width of 580 μs was extracted.

FIG. 15 shows the result that calculated the end point through the time-frequency domain reflectometry method. With reference to FIG. 15, it may be seen the length 202 of the end point of the ±250 kV HVDC cable between Jindo and Jeju is accurately predicted to be 113.7 km.

Figure 16:
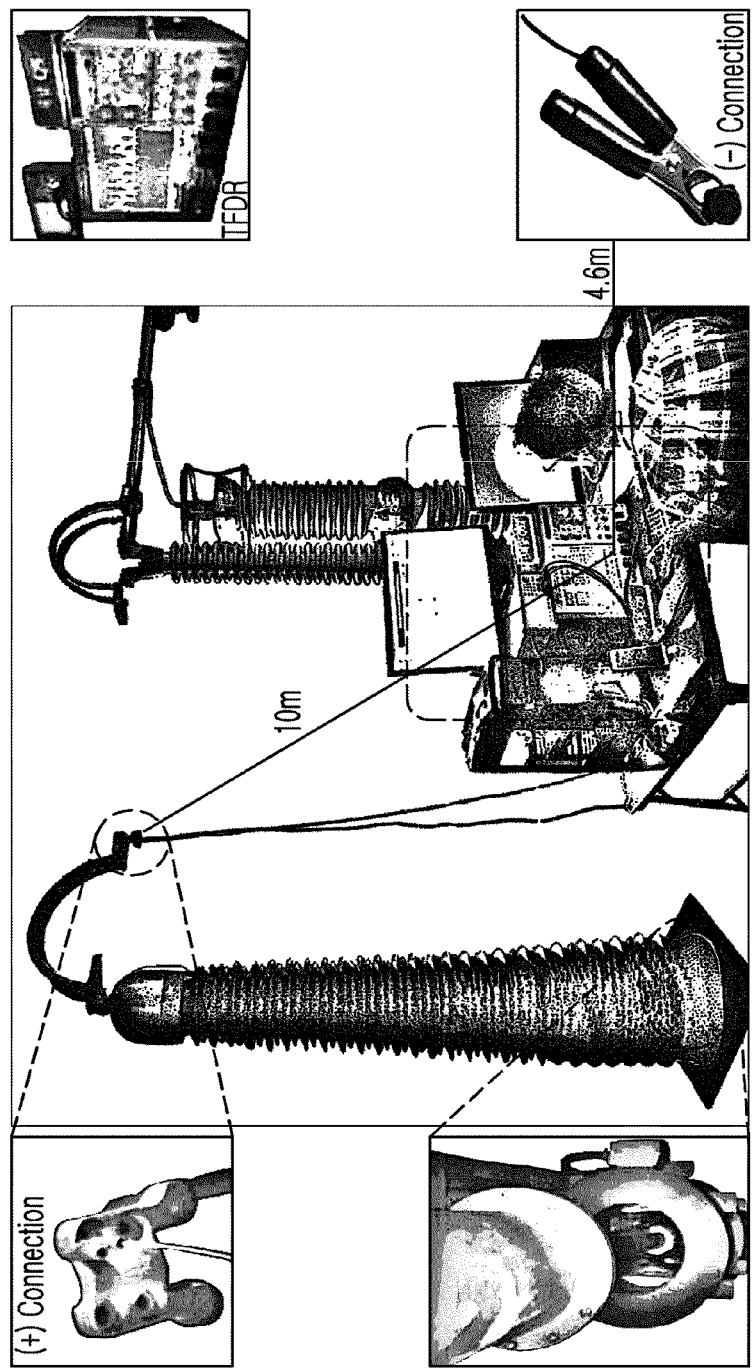
FIGS. 16 and 17 are views illustrating a facility and a result, respectively, of the verification test performed for ±180 kV Haenam-Jeju HVDC cable.
Figure 17:
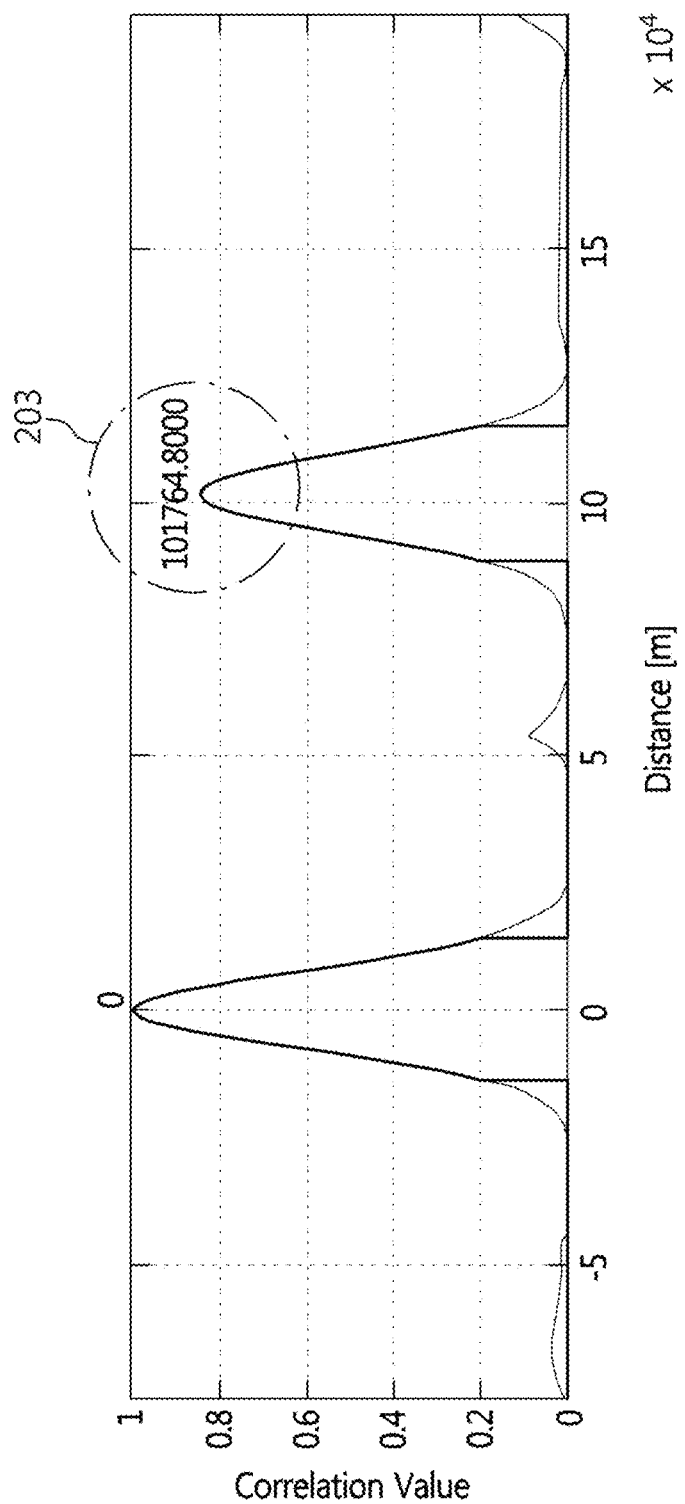

FIGS. 16 and 17 are views illustrating a facility and a result, respectively, of the verification test performed for the ±180 kV Haenam-Jeju HVDC cable.

FIGS. 16 and 17 show the facility and the result, respectively, of the verification test executed for the ±180 kV HVDC cable between Haenam and Jeju. The HVDC submarine cable between Haenam and Jeju uses the cable of MI 800 mm², and the total line length is 101.67 km.

FIG. 16 shows a verification test process, and in order to design an optimal reference signal of the time-frequency domain reflectometry method, the optimal reference signal was designed through sequential observation of the cross-correlation function in the order of selection of the center frequency, frequency bandwidth, and time width. Here, an optimal reference signal having center frequency of 3 kHz, frequency bandwidth of 6 kHz, and time width of 570 μs was extracted.

FIG. 17 shows the result that calculated the end point through the time-frequency domain reflectometry method. With reference to FIG. 17, it may be seen the length 203 of the end point of the ±180 kV HVDC cable between Haenam and Jeju is accurately predicted to be 101.7 km.

The method according to some embodiments may be implemented in a form of program instructions that may be executed through various computer means, thereby being recorded on a computer-readable medium. The computer-readable medium may include program instructions, data files, data structures, and the like alone or in combination. The program instructions recorded on the medium may be specially designed and configured for the present invention, or may be known and usable by those skilled in computer software. Examples of computer-readable recording media include magnetic media such as hard disks, floppy disks, and magnetic tapes, optical media such as CDROMs and DVDs, magneto-optical media such as floptical disks, and hardware apparatus specially configured to store and execute program instructions such as ROM, RAM, flash memory, and the like. Examples of program instructions include a high-level language code that may be executed by a computer using an interpreter, and the like as well as a machine language code produced by a compiler.

Although the above description has been described with a focus on the novel features of the present invention applied to various embodiments, a person skilled in the art will be understood that various deletions, substitutions, and changes are possible in the form and details of the apparatus and method described above without departing from the scope of the present invention. Accordingly, the scope of the invention is defined by the appended claims rather than in the above description. All modifications within the equivalent scope of the claims are covered by the scope of the present invention.

The invention claimed is:

1. An apparatus for detecting a fault location of an underground cable according to an embodiment of the present invention, the apparatus comprising:
    an optimal reference signal design unit configured to design a reference signal for detecting the fault location of the underground cable considering propagation characteristics of the underground cable according to a time-frequency domain reflectometry method;
    a signal application and acquisition unit configured, as the designed reference signal is generated and applied to the underground cable, to acquire the reference signal applied to the underground cable and a reflected signal of the applied reference signal; and
    a data analysis unit configured to analyze whether a fault location of the underground cable exists according to a decision on similarity between the reference signal and the reflected signal after obtaining a time-frequency domain energy distribution for the acquired reference signal and reflected signal,
    wherein the optimal reference signal design unit comprises:
    a signal and algorithm setting unit configured to set signal information and algorithm information for designing the reference signal for detecting a fault location of the underground cable,
    a center frequency determination unit configured to determine optimal center frequency candidate group by checking a change in magnitude of a cross-correlation function according to a change in the center frequency after identifying maximum center frequency through an endpoint check, a frequency bandwidth determination unit configured to determine optimal frequency bandwidth by checking a change in the magnitude of the cross-correlation function according to a change in the frequency bandwidth after fixing the center frequency candidate group and the appropriate time width, and a time width determination unit configured to determine optimal time width b checking a change in magnitude of the cross-correlation function according to a change in the time width after fixing the center frequency candidate group and the optimal frequency bandwidth, wherein the optimal reference signal design unit selects center frequency, frequency bandwidth, and time width of the reference signal in values optimized for the underground cable in order for detecting a fault location of the underground cable.

2. The apparatus of claim 1, wherein the propagation characteristics of the underground cable are a cable structure, cable insulation layer material, and a type of cable installation.

3. The apparatus of claim 1, wherein the selected frequency bandwidth and time width of the reference signal are set so as to have a value of a product thereof to be at least 0.5.

4. The apparatus of claim 1, wherein the signal application and acquisition unit comprises:

a reference signal generation unit configured to generate the designed reference signal;

a waveform measurement unit configured to measure the reference signal applied to the underground cable and the reflected signal for the applied reference signal; and an underground cable connection unit configured to apply the reference signal generated by the reference signal generation unit to the underground cable and transfer the reflected signal transferred from the underground cable to the waveform measurement unit.

5. The apparatus of claim 4, further comprising:

an amplification unit connected to the reference signal generation unit and configured to apply the amplified reference signal to the underground cable through the underground cable connection unit by amplifying the reference signal generated by the reference signal generation unit.

6. The apparatus of claim 4, wherein the underground cable connection unit is configured by connecting a T connector and a BNC connector in series, and the BNC connector is configured to have a (+) terminal connected to a conductor layer of the underground cable and a (−) terminal connected to a sheath layer of the underground cable.

7. The apparatus of claim 1, wherein the data analysis unit is configured to obtain the time-frequency domain energy distribution for the acquired reference signal and reflected signal, through a localized Wigner-Ville distribution for as much as a specific section.

8. The apparatus of claim 1, wherein the data analysis unit is configured to decide similarity between the reference signal and reflected signal using a normalized value between zero and one through a cross-correlation function of the time-frequency domain for the reference signal and reflected signal.

9. The apparatus of claim 1, further comprising:

a user interface unit configured to provide a graphic user interface (GUI) for a processing process of each of the optimal reference signal design unit, the signal application and acquisition unit, and the data analysis unit.

10. A method for detecting a fault location of an underground cable according to an embodiment of the present invention, the method comprising:

designing a reference signal for detecting a fault location of the underground cable considering propagation characteristics of the underground cable according to a time-frequency domain reflectometry method;

acquiring the reference signal applied to the underground cable and the reflected signal of the applied reference signal, as the designed reference signal is generated and applied to the underground cable; and analyzing whether a fault location of the underground cable exists according to a decision on similarity between the reference signal and the reflected signal after obtaining a time-frequency domain energy distribution for the acquired reference signal and reflected signal, wherein the designing comprises:

setting signal information and algorithm information for designing a reference signal for detecting a fault location of the under round cable;

determining optimal center frequency candidate group by checking a change in magnitude of a cross-correlation function according to a change in the center frequency after identifying maximum center frequency through an endpoint check;

determining optimal frequency bandwidth by checking a change in magnitude of the cross-correlation function according to a change in the frequency bandwidth after fixing the center frequency candidate group and the appropriate time width; and determining optimal time width by checking a change in magnitude of the cross-correlation function according to a change in the time width after fixing the center frequency candidate group and the appropriate time width.

11. The method of claim 10, wherein the analyzing obtains the time-frequency domain energy distribution for the acquired reference signal and reflected signal, through a localized Wigner-Ville distribution for as much as a specific section.

12. The method of claim 10, wherein the analyzing decides similarity between the reference signal and reflected signal using a normalized value between zero and one through a cross-correlation function of the time-frequency domain for the reference signal and reflected signal.

* * * * *